(12) United States Patent
Lai et al.

(10) Patent No.: US 12,112,708 B2
(45) Date of Patent: Oct. 8, 2024

(54) DISPLAY PANEL AND DISPLAY DEVICE

(71) Applicant: Xiamen Tianma Micro-Electronics Co., Ltd., Xiamen (CN)

(72) Inventors: Qingjun Lai, Xiamen (CN); Yihua Zhu, Xiamen (CN); Yong Yuan, Shanghai (CN); Ping An, Shanghai (CN); Zhaokeng Cao, Shanghai (CN)

(73) Assignee: Xiamen Tianma Micro-Electronics Co., Ltd., Xiamen (CN)

( * ) Notice: Subject to any disclaimer, the term of this patent is extended or adjusted under 35 U.S.C. 154(b) by 0 days.

(21) Appl. No.: 18/198,013

(22) Filed: May 16, 2023

(65) Prior Publication Data

US 2023/0282145 A1   Sep. 7, 2023

(51) Int. Cl.
*G09G 3/3266* (2016.01)
*G09G 3/20* (2006.01)
*G09G 3/3233* (2016.01)
*G11C 19/20* (2006.01)
*G11C 19/28* (2006.01)

(52) U.S. Cl.
CPC ............. *G09G 3/3266* (2013.01); *G09G 3/20* (2013.01); *G11C 19/20* (2013.01); *G11C 19/28* (2013.01); *G09G 3/3233* (2013.01); *G09G 2300/0426* (2013.01); *G09G 2300/0819* (2013.01); *G09G 2300/0842* (2013.01); *G09G 2300/0861* (2013.01); *G09G 2310/0286* (2013.01); *G09G 2310/061* (2013.01); *G09G 2310/08* (2013.01)

(58) Field of Classification Search
CPC ............... G09G 3/20; G09G 3/3266; G09G 2300/0426; G09G 2300/0819; G09G 2300/0842; G09G 2310/0286; G09G 2310/061; G09G 2310/08; G09G 3/3233; G09G 2300/0861; G11C 19/20; G11C 19/28

See application file for complete search history.

(56) References Cited

U.S. PATENT DOCUMENTS

| | | | |
|---|---|---|---|
| 10,181,276 B2 | 1/2019 | Lee et al. | |
| 2018/0082652 A1 | 3/2018 | Lv et al. | |
| 2019/0130847 A1 | 5/2019 | Um et al. | |
| 2021/0193025 A1* | 6/2021 | Xu | G09G 3/3266 |
| 2021/0335202 A1 | 10/2021 | Feng et al. | |
| 2022/0036788 A1* | 2/2022 | Shi | G09G 3/20 |
| 2022/0076611 A1 | 3/2022 | Lai et al. | |

FOREIGN PATENT DOCUMENTS

CN          110033734 A   *   7/2019   ........... G09G 3/3208

* cited by examiner

*Primary Examiner* — Abhishek Sarma
(74) *Attorney, Agent, or Firm* — Anova Law Group, PLLC

(57) ABSTRACT

A display panel includes a pixel circuit and a driving circuit. The pixel circuit includes a driving transistor. The driving circuit is configured to provide a signal for the pixel circuit, receive a third voltage signal and a fourth voltage signal, and generate an output signal. The third voltage signal is a high-level signal, and the fourth voltage signal is a low-level signal. A working process of the pixel circuit includes a reset phase and a bias phase. The output signal of the driving circuit is a reset signal in the reset phase. The output signal of the driving circuit is a bias signal in the bias phase. In response to the driving transistor being a PMOS transistor, the reset signal is the fourth voltage signal, and the bias signal is the third voltage signal.

20 Claims, 14 Drawing Sheets

DISPLAY PANEL AND DISPLAY DEVICE

CROSS-REFERENCE TO RELATED APPLICATION

This application is a continuation of application Ser. No. 17/451,687, filed on Oct. 21, 2021, which claims the priority of Chinese Patent Application No. 202110025583.3, filed on Jan. 8, 2021, the entire contents of all of which are incorporated herein by reference.

TECHNICAL FIELD

The present disclosure generally relates to the field of display technology and, more particularly, relates to a display panel and a display device.

BACKGROUND

With the continuous development of display technologies, more and more electronic devices with display functions are widely used in people's daily life and work, and bringing great convenience to people's daily life and work.

The main component of the electronic device to realize the display function is the display panel. Among them, the scan driving circuit in the display panel outputs the driving signals, and the gate line and other signal lines are used to transmit the driving signals to the pixel circuits in the pixel array such that the pixel array can be controlled to display a picture.

However, the existing scan driving circuits may not be able to meet the different voltage requirements of the pixel circuit for different signals. There is need to improve the scan driving circuits. The disclosed display panels and the display devices are directed to solve one or more problems set forth above and other problems in the art.

SUMMARY

One aspect of the present disclosure provides a display panel. The display panel includes a pixel circuit and a driving circuit. The pixel circuit includes a driving transistor. The driving circuit is configured to provide a signal for the pixel circuit, receive a third voltage signal and a fourth voltage signal, and generate an output signal. The third voltage signal is a high-level signal, and the fourth voltage signal is a low-level signal. A working process of the pixel circuit includes a reset phase and a bias phase. The output signal of the driving circuit is a reset signal in the reset phase. The output signal of the driving circuit is a bias signal in the bias phase. In response to the driving transistor being a PMOS transistor, the reset signal is the fourth voltage signal, and the bias signal is the third voltage signal. In some other embodiments, in response to the driving transistor being an NMOS transistor, the reset signal is the third voltage signal, and the bias signal is the fourth voltage signal.

Another aspect of the present disclosure provides a display device. The display device includes a pixel circuit and a driving circuit. The pixel circuit includes a driving transistor. The driving circuit is configured to provide a signal for the pixel circuit, receive a third voltage signal and a fourth voltage signal, and generate an output signal. The third voltage signal is a high-level signal, and the fourth voltage signal is a low-level signal. A working process of the pixel circuit includes a reset phase and a bias phase. The output signal of the driving circuit is a reset signal in the reset phase. The output signal of the driving circuit is a bias signal in the bias phase. In response to the driving transistor being a PMOS transistor, the reset signal is the fourth voltage signal, and the bias signal is the third voltage signal. In some other embodiments, in response to the driving transistor being an NMOS transistor, the reset signal is the third voltage signal, and the bias signal is the fourth voltage signal.

Other aspects of the present disclosure can be understood by those skilled in the art in light of the description, the claims, and the drawings of the present disclosure.

BRIEF DESCRIPTION OF THE DRAWINGS

To explain the embodiments of the present disclosure or the technical solutions in the prior art more clearly, the following will briefly introduce the drawings that need to be used in the description of the embodiments or the prior art. Obviously, the drawings in the following description are only embodiments of the present disclosure. For those of ordinary skill in the art, other drawings can be obtained according to the provided drawings without creative work. The following drawings are merely examples for illustrative purposes according to various disclosed embodiments and are not intended to limit the scope of the present disclosure.

DETAILED DESCRIPTION

The above is the core idea of the present disclosure. To make the above objectives, features and advantages of the present disclosure more obvious and easier to understand, the technical solutions in the embodiments of the present disclosure will be clearly and completely described below in conjunction with the accompanying drawings in the embodiments of the present disclosure. Obviously, the described embodiments are only portions of the embodiments of the present disclosure, rather than all the embodiments. Based on the embodiments of the present disclosure, all other embodiments obtained by those of ordinary skill in the art without creative work shall fall within the protection scope of the present disclosure.

Figure 1:
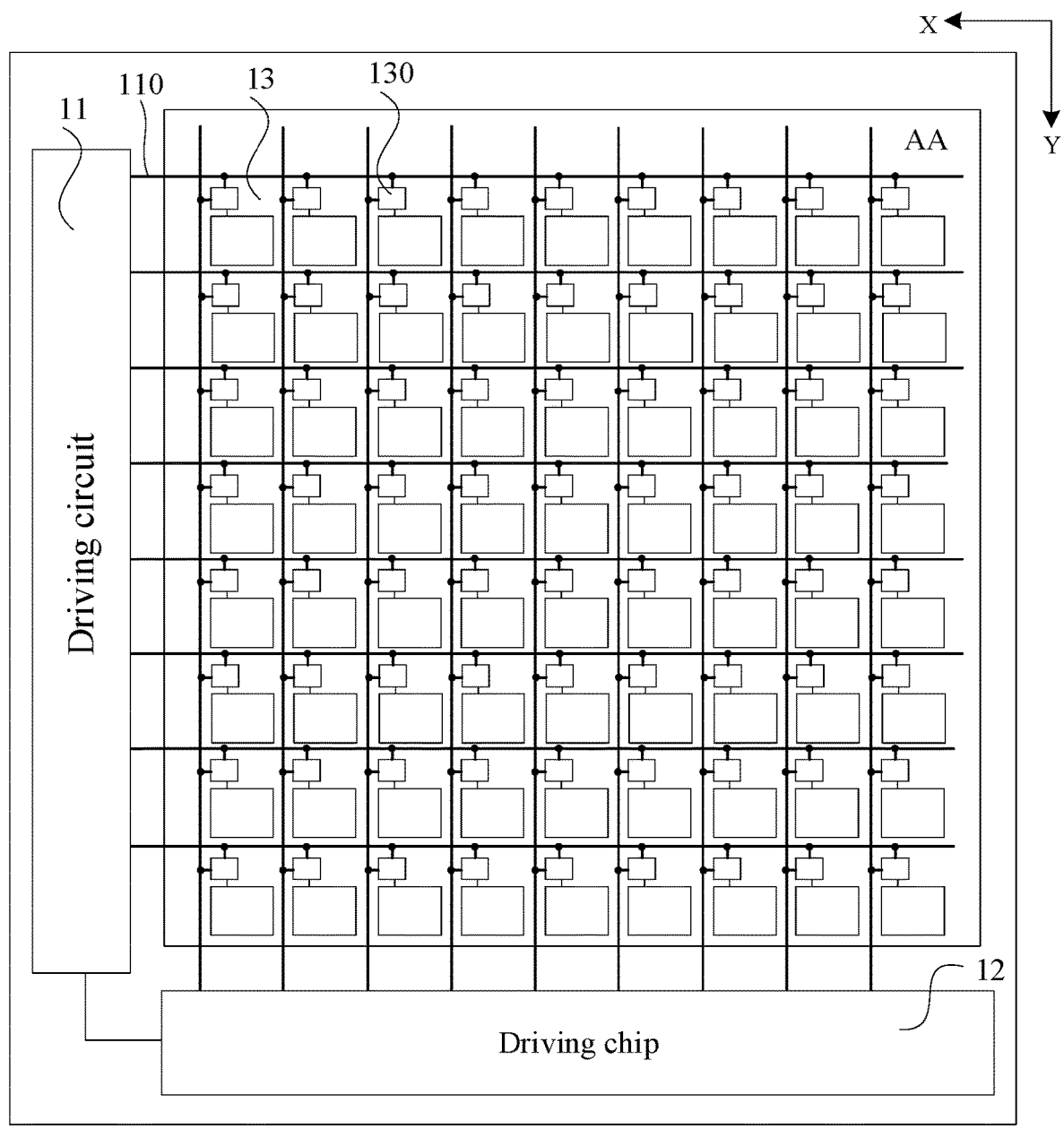
FIG. 1 illustrates a top view of an exemplary display panel consistent with various disclosed embodiments of the present disclosure.

The present disclosure provides a display panel. FIG. 1 illustrates a top view of an exemplary display panel consistent with various disclosed embodiments of the present disclosure.

As shown in FIG. 1. the display panel may include a driving circuit 11, a driving chip 12, and a plurality of pixels 13. Each pixel 13 may include a pixel circuit 130. The driving circuit 11 may be connected to the pixel circuit 130 through a signal line to provide a driving signal to the pixel circuit 130 such that the pixel circuit 130 may drive the pixel 13 to emit light and display a picture.

It should be noted that FIG. 1 only illustrates one structure of the display panel. In some embodiments, the driving circuit 11 may be located not only on one side of the display panel, but also on both sides of the display panel, for example, may be located on the left and right sides of the display panel.

Figure 2:
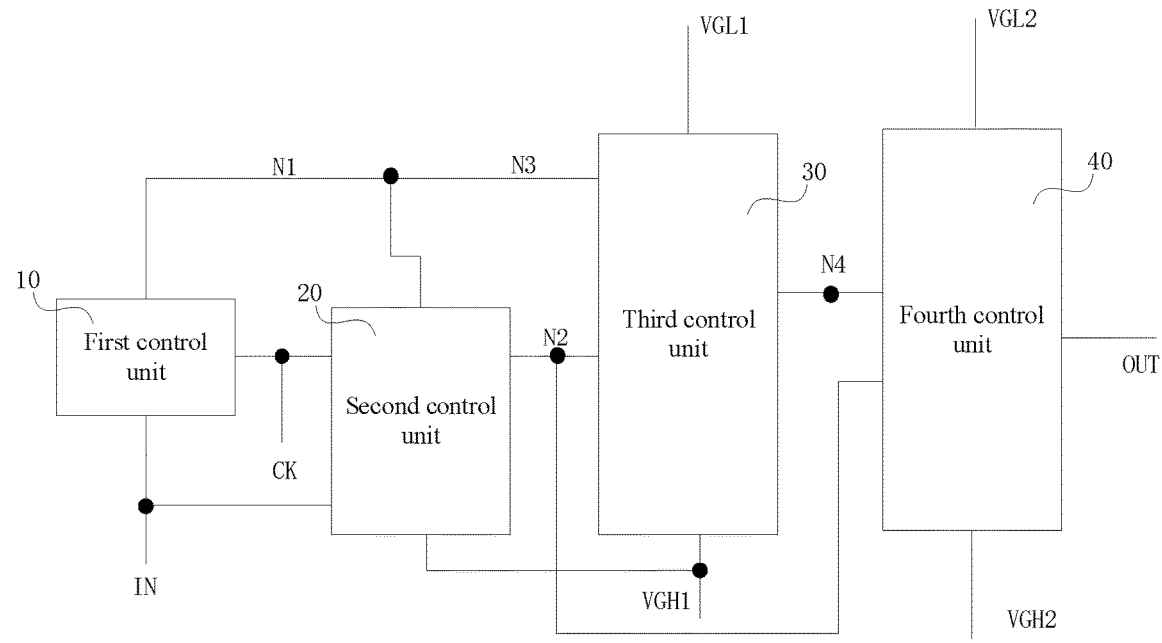
FIG. 2 illustrates an exemplary shift register consistent with various disclosed embodiments of the present disclosure.

In one embodiment of the present disclosure, the driving circuit 11 may include a number N levels of shift registers cascaded with each other, and N≥2. FIG. 2 illustrates an exemplary shift register consistent with various disclosed embodiments of the present disclosure. As shown in FIG. 2, a shift register of the driving circuit 11 may include a first control unit 10, a second control unit 20, a third control unit 30, and a fourth control unit 40.

The first control unit 10 may be configured to receive the input signal IN and control the signal of the first node N1 in response to the first clock signal CK. The second control unit 20 may be configured to receive the first voltage signal VGH1 and control the signal of the second node N2 in response to the input signal IN and the first clock signal CK. The third control unit 30 may be configured to receive the first voltage signal VGH1 and the second voltage signal VGL1, and control the signal of the fourth node N4 in response to the signal of the second node N2 and the signal of the third node N3. The third node N3 may be connected to the first node N1. The first voltage signal VGH1 may be a high-level signal, and the second voltage signal VGL1 may be a low-level signal.

The fourth control unit 40 may be configured to receive the third voltage signal VGH2 and the fourth voltage signal VGL2, and generate an output signal OUT in response to the signal of the second node N2 and the signal of the fourth node N4. The third voltage signal VGH2 may be a high-level signal, and the fourth voltage signal VGL2 may be a low-level signal. The potential of the first voltage signal VGH1 may be higher than the potential of the third voltage signal VGH2, and/or, the potential of the second voltage signal VGL1 may be lower than the potential of the fourth voltage signal VGL2.

In one embodiment of the present disclosure, the first voltage signal VGH1 and the second voltage signal VGL1 may be provided to the first control unit 10, the second control unit 20, and the third control unit 30 to ensure that the first control unit 10 and the second control unit 20 and the third control unit 30 to work with a normal manner. The third voltage signal VGH2 and the fourth voltage signal VGL2 may be provided to the fourth control unit 40 to cause the fourth control unit 40 to generate the output signal OUT. Thus, the voltage signal of the fourth control unit 40 and the voltage signals of the first control unit 10, the second control unit 20, and the third control unit 30 may be separately provided. Accordingly, the third voltage signal VGH2 and the fourth voltage signal VGL2 may be changed to change the voltage of the output signal OUT such that the voltage of the output signal OUT of the shift register may meet the different voltage requirements of the pixel circuits for different signals. Thus, the flexibility of the voltage of the output signal OUT of the driving circuit 11 may be improved.

Further, because the potential of the first voltage signal VGH1 may be higher than the potential of the third voltage signal VGH2, and/or the potential of the second voltage signal VGL1 may be lower than the potential of the fourth voltage signal VGL2, the waveform stability of the output signal OUT generated by the fourth control unit 40 may be increased.

Figure 3:
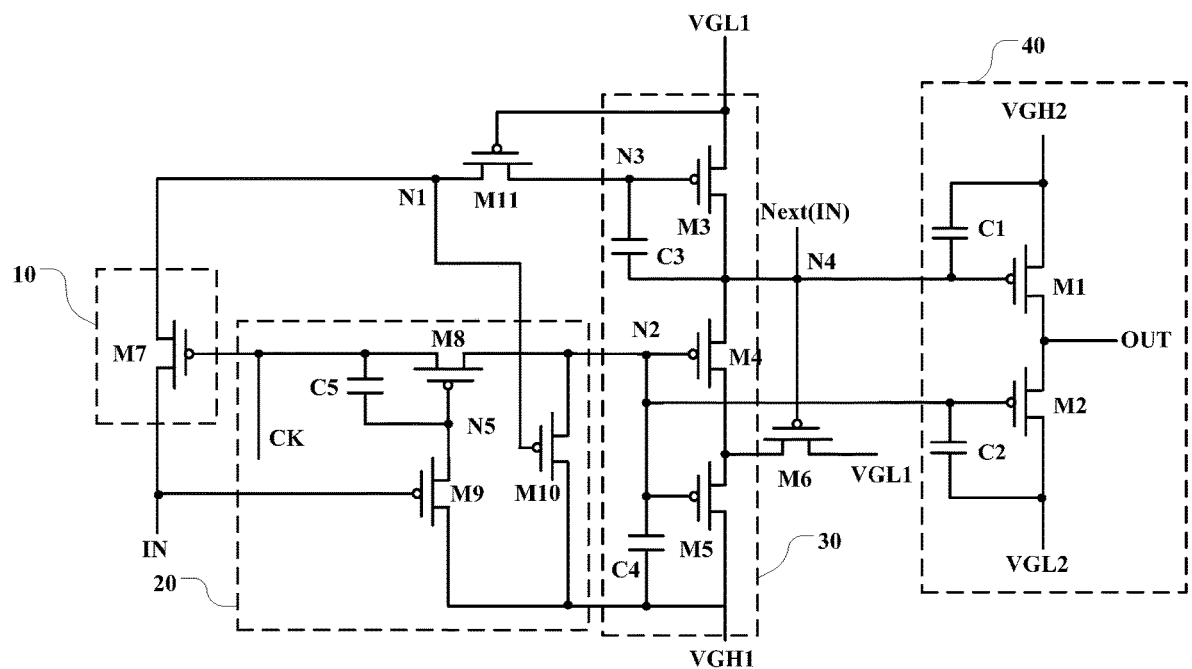
FIG. 3 illustrates another exemplary shift register consistent with various disclosed embodiments of the present disclosure.

FIG. 3 is a schematic structural diagram of another exemplary shift register consistent with various disclosed embodiments of the present disclosure. As shown in FIG. 3, in some embodiments of the present disclosure, the fourth control unit 40 may include a first transistor M1 and a second transistor M2. Among them, one of the first transistor M1 and the second transistor M2 may respond to the signal of the fourth node N4, and the other transistor may respond to the signal of the second node N2 to control the output signal OUT. For example, the first transistor M1 may respond to the signal of the fourth node N4, and the second transistor M2 may respond to the signal of the second node N2 to control the output signal OUT. In another embodiments, the first transistor M1 may respond to the signal of the second node N2 and the second transistor M2 may respond to the signal of the fourth node N4 to control the output signal OUT.

In some embodiments of the present disclosure, as shown in FIG. 3, the first transistor M1 and the second transistor M2 may be both PMOS transistors. The source of the first transistor M1 may be connected to the third voltage signal VGH2, the drain may be connected to the output signal OUT, and the gate may be connected to the fourth node N4. The source of the second transistor M2 may be connected to the fourth voltage signal VGL2, the drain may be connected to the output signal OUT, and the gate may be connected to the second node N2.

When the fourth node N4 is at a low-level, the first transistor M1 may be turned on, and the third voltage signal VGH2 may be transmitted to the drain to generate the output signal OUT. When the fourth node N4 is at a high-level, the first transistor M1 may be turned off. When the second node N2 is at a low-level, the second transistor M2 may be turned on, and the fourth voltage signal VGL2 may be transmitted to the drain to generate the output signal OUT. When the second node N2 is at a high-level, the second transistor M2 may be turned off. For example, the high-level of the output signal OUT may be determined by the fourth node N4, and the low-level of the output signal OUT may be determined by the second node N2.

Figure 4:
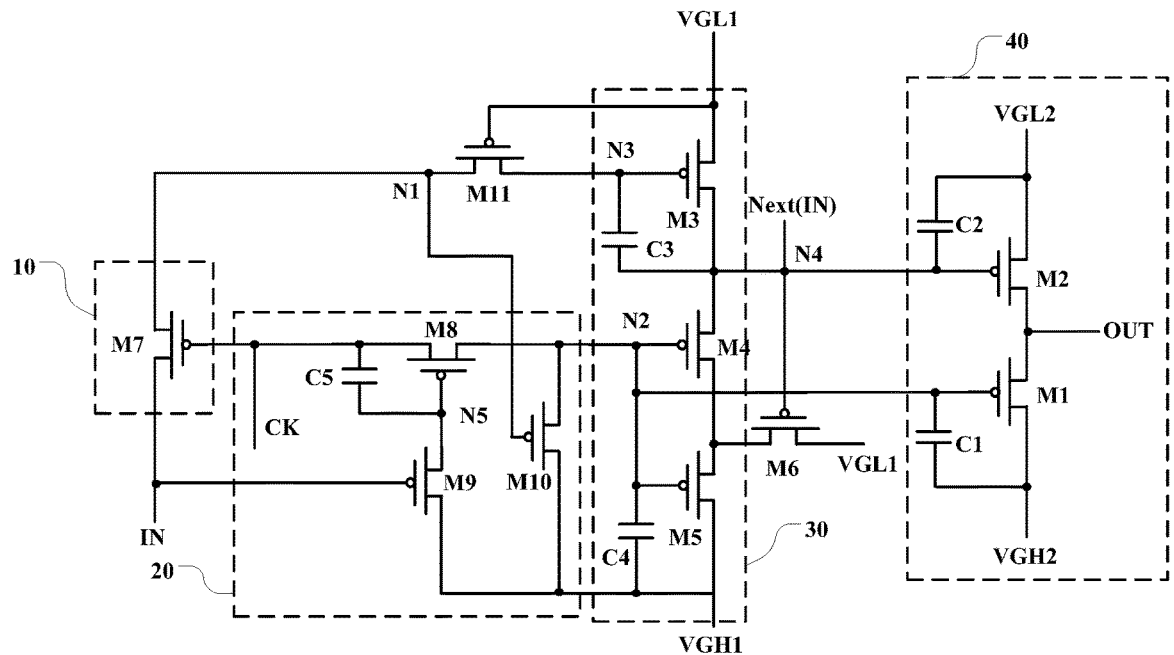
FIG. 4 illustrates another exemplary shift register consistent with various disclosed embodiments of the present disclosure.

FIG. 4 is a schematic structural diagram of another exemplary shift register consistent with various disclosed embodiments of the present disclosure. As shown in FIG. 4, in other embodiments, the source of the first transistor M1 may be connected to the third voltage signal VGH2, the drain may be connected to the output signal OUT, and the gate may be connected to the second node N2. The source of the second transistor M2 may be connected to the fourth voltage signal VGL2, the drain may be connected to the output signal OUT, and the gate may be connected to the fourth node N4.

When the fourth node N4 is at a low-level, the second transistor M2 may be turned on, and the fourth voltage signal VGL2 may be transmitted to the drain to generate the output signal OUT. When the fourth node N4 is at a high-level, the second transistor M2 may be turned off. When the second node N2 is at a low-level, the first transistor M1 may be turned on, and the third voltage signal VGH2 may be transmitted to the drain to generate the output signal OUT. When the second node N2 is at a high-level, the first transistor M1 may be turned off. For example, the low-level of the output signal OUT may be determined by the fourth node N4, and the high-level of the output signal OUT may be determined by the second node N2.

Figure 5:
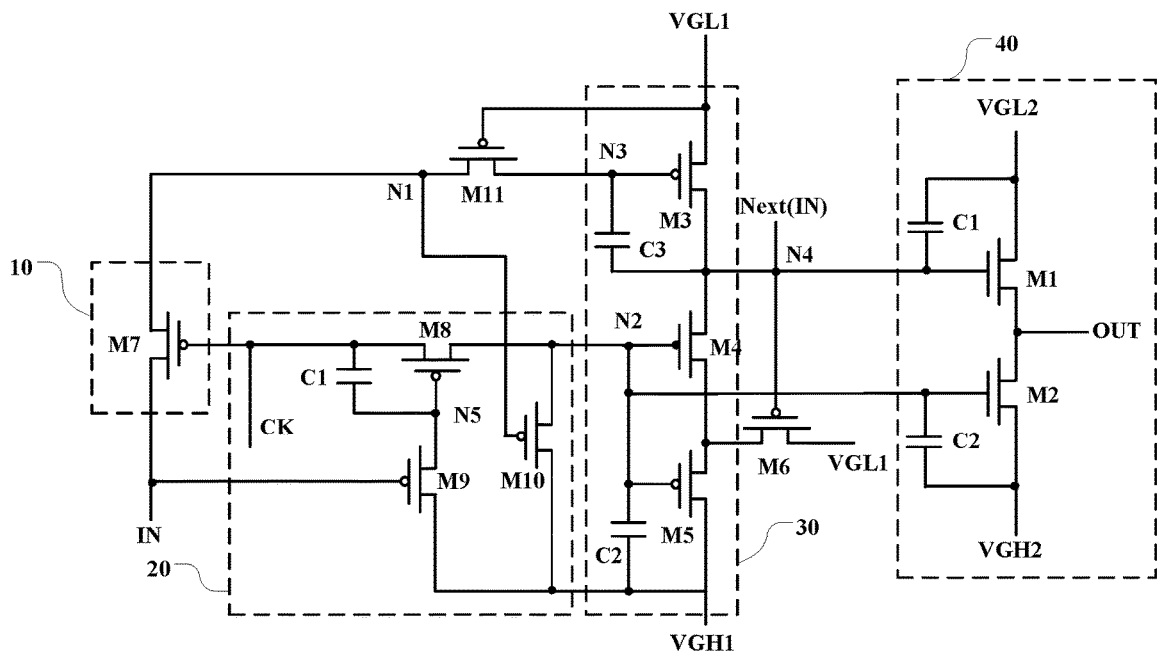
FIG. 5 illustrates another exemplary shift register consistent with various disclosed embodiments of the present disclosure.

FIG. 5 is schematic structural diagram of another exemplary shift register consistent with various disclosed embodiments of the present disclosure. In other embodiments of the present disclosure, as shown in FIG. 5, the first transistor M1 and the second transistor M2 may also be NMOS transistors. The source of the first transistor M1 may be connected to the fourth voltage signal VGL2, the drain may be connected to the output signal OUT, and the gate may be connected to the fourth node N4. The source of the second transistor M2 may be connected to the third voltage signal VGH2, the drain may be connected to the output signal OUT, and the gate may be connected to the second node N2.

When the fourth node N4 is at a low-level, the first transistor M1 may be turned off. When the fourth node N4 is at a high-level, the first transistor M1 may be turned on, and the fourth voltage signal VGL2 may be transmitted to the drain to generate the output signal OUT. When the second node N2 is at a low-level, the second transistor M2 may be turned off. When the second node N2 is at a high-level, the second transistor M2 may be turned on, and the third voltage signal VGH2 may be transmitted to the drain to generate the output signal OUT. For example, the low-level of the output signal OUT may be determined by the fourth node N4, and the high-level of the output signal OUT may be determined by the second node N2.

Figure 6:
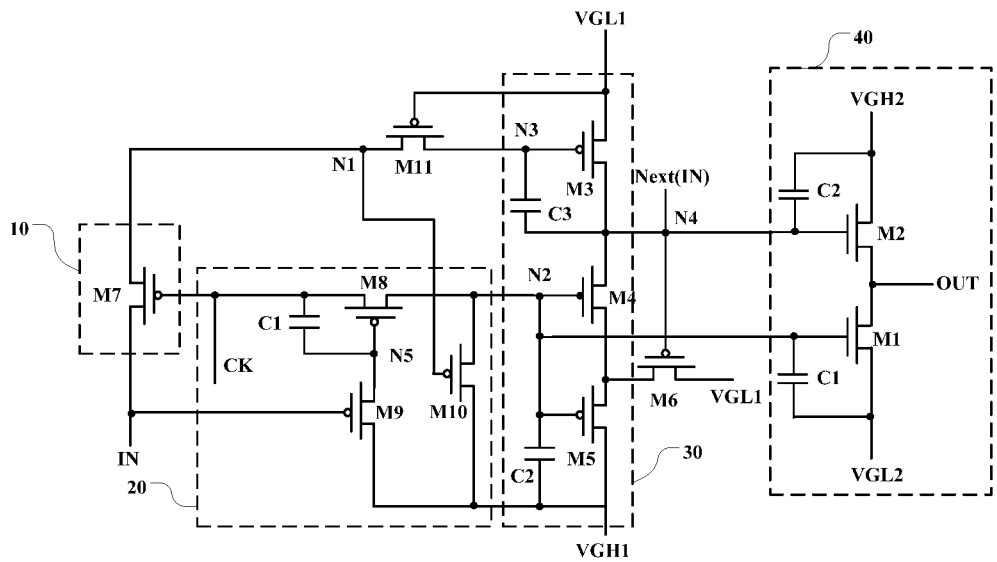
FIG. 6 illustrates another exemplary shift register consistent with various disclosed embodiments of the present disclosure.

FIG. 6 is schematic structural diagram of another exemplary shift register consistent with various disclosed embodiments of the present disclosure. In other embodiments of the present disclosure, as shown in FIG. 6. the first transistor M1 and the second transistor M2 may also be both NMOS transistors. The source of the first transistor M1 may be connected to the fourth voltage signal VGL2, the drain may be connected to the output signal OUT, and the gate may be connected to the second node N2. The source of the second transistor M2 may be connected to the third voltage signal VGH2, the drain may be connected to the output signal OUT, and the gate may be connected to the fourth node N4.

When the fourth node N4 is at a low-level, the second transistor M2 may be turned off. When the fourth node N4 is at a high-level, the second transistor M2 may be turned on, and the third voltage signal VGH2 may be transmitted to the drain to generate the output signal OUT. When the second node N2 is at a low-level, the first transistor M1 may be turned off. When the second node N2 is at a high-level, the first transistor M1 may be turned on, the fourth voltage signal VGL2 may be transmitted to the drain to generate the output signal OUT. For example, the high-level of the output signal OUT may be determined by the fourth node N4, and the low-level of the output signal OUT may be determined by the second node N2.

Based on any of the foregoing embodiments, in some embodiments of the present disclosure, to ensure the stability of the potentials of the second node N2 and the fourth node N4 and the stability of the output signal OUT, the fourth control unit 40 may further include a first capacitor C1 and a second capacitor C2.

As shown in FIG. 3 and FIG. 5, the first plate of the first capacitor C1 may be connected to the third voltage signal VGH2, and the second plate of the first capacitor C1 may be connected to the fourth node N4. The first plate of the second capacitor C2 may be connected to the fourth voltage signal VGL2, and the second plate of the second capacitor C2 may be connected to the second node N2. In some embodiments, as shown in FIG. 4 and FIG. 6, the first plate of the first capacitor C1 may be connected to the third voltage signal VGH2, and the second plate of the first capacitor C1 may be connected to the second node N2. The first plate of the second capacitor C2 may be connected to the fourth voltage signal VGL2, and the second plate of the second capacitor C2 may be connected to the fourth node N4.

In other embodiments of the present disclosure, the second plate of the first capacitor C1 may be connected to the fourth node N4, the connection mode of the first electrode plate may be adjusted, and the first electrode plate may be connected to any one of the first voltage signal VGH1, the second voltage signal VGL1, the third voltage signal VGH2, the fourth voltage signal VGL2, and the output signal OUT. The potential of the fourth node N4 may be stabilized mainly through a constant potential or an output signal. The second plate of the second capacitor C2 may be connected to the second node N2 and the connection mode of the first plate may be adjusted. The first plate may be connected to any one of the first voltage signal VGH1, the second voltage signal VGL1, the third voltage signal VGH2, the fourth voltage signal VGL2 and the output signal OUT. The potential of the second node N2 may be stabilized mainly through a constant potential or an output signal.

Based on any of the foregoing embodiments, in some embodiments of the present disclosure, as shown in FIGS. 3-6, the first control unit 10 may include a seventh transistor M7. The source of the seventh transistor M7 may be connected to the input signal IN, the drain may be connected to the first node N1, and the gate may be connected to the first clock signal CK.

The second control unit 20 may include an eighth transistor M8, a ninth transistor M9, a tenth transistor M10, and a fifth capacitor C5. The source of the eighth transistor M8 may be connected to the first clock signal CK, the drain may be connected to the second node N2, and the gate may be connected to the fifth node N5. The source of the ninth transistor M9 may be connected to the first voltage signal VGH1, the drain may be connected to the fifth node N5, and the gate may be connected to the input signal IN. The source of the tenth transistor M10 may be connected to the first voltage signal VGH1, the drain may be connected to the second node N2, and the gate may be connected to the first node N1. The first plate of the fifth capacitor C5 may be connected to the first clock signal CK, and the second plate of the fifth capacitor C5 may be connected to the fifth node N5.

Based on any of the foregoing embodiments, in some embodiments of the present disclosure, as shown in FIGS. 3-6, the third control unit 30 may include a third transistor M3 and a fourth transistor M4. The source of the third transistor M3 may be connected to the second voltage signal VGL1, the drain may be connected to the fourth node N4, and the gate may be connected to the third node N3. The source of the fourth transistor M4 may be connected to the first voltage signal VGH1, the drain may be connected to the fourth node N4, and the gate may be connected to the second node N2.

Because the first transistor M1 and the second transistor M2 may be output transistors, to ensure the stability of the output signal OUT, the output performance requirements of the first transistor M1 and the second transistor M2 may be relatively high. Thus, in some embodiments of the present disclosure, to improve the output performance of the first transistor M1 and the second transistor M2, the width-to-length ratio of the channel region of the first transistor M1 may be greater than the width-to-length ratio of the channel region of the fourth transistor M4, and/or the width-to-length ratio of the channel region of the second transistor M2 may be greater than the width-to-length ratio of the channel region of the third transistor M3.

Based on any of the foregoing embodiments, in some embodiments of the present disclosure, as shown in FIGS. 3-6, the third control unit 30 may further include a third capacitor C3 and a fourth capacitor C4. The first plate of the third capacitor C3 may be connected to the third node N3, and the second plate of the third capacitor C3 may be connected to the fourth node N4. The first plate of the fourth capacitor C4 may be connected to the second node N2, and the second plate of the fourth capacitor C4 may be connected to the first voltage signal VGH1.

Because the functions of the first capacitor C1 and the second capacitor C2 may be to stabilize the potentials of the second node N2 and the fourth node N4 to stabilize the output signal OUT, the capacitances of the first capacitor C1 and the second capacitor C2 may need to be large enough to ensured that the potentials of the second node N2 and the fourth node N4 may not easily fluctuate.

Thus, in some embodiments of the present disclosure, the capacitance of the second capacitor C2 may be greater than the capacitance of the third capacitor C3; and/or, the capacitance of the first capacitor C1 may be greater than the capacitance of the fourth capacitor C4. In other embodiments, to simplify the manufacturing process, the capacitance of the second capacitor C2 may be equal to the capacitance of the third capacitor C3; and/or the capacitance of the first capacitor C1 may be equal to the capacitance of the fourth capacitor C4.

In other embodiments of the present disclosure, to ensure the stability of the potentials of the second node N2 and the fourth node N4, the capacitance of the first capacitor C1 may be greater than the capacitance of the fifth capacitor C5, and the capacitance of the second capacitor C2 may be greater than the capacitance of the fifth capacitor C5. Similarly, in other embodiments, to simplify the manufacturing process, the capacitance of the first capacitor C1 may be equal to the capacitance of the fifth capacitor C5, and the capacitance of the second capacitor C2 may be equal to the capacitance of the fifth capacitor C5.

In other embodiments of the present disclosure, to ensure the stability of the potentials of the second node N2 and the fourth node N4, the capacitance of the first capacitor C1 may be greater than the capacitance of the fourth capacitor C4, and the capacitance of the second capacitor C2 may be greater than the capacitance of the third capacitor C3. Similarly, in other embodiments, to simplify the manufacturing process, the capacitance of the first capacitor C1 may be equal to the capacitance of the fourth capacitor C4, and the capacitance of the second capacitor C2 may be equal to the capacitance of the third capacitor C3.

Because the stability of the second node N2 and the fourth node N4 may also affect the stability of the output signal OUT, and the stability of the fifth node N5 may have little effect on the stability of the output signal OUT. Thus, the fifth capacitor C5 may be set to be substantially small to save space.

Thus, in some embodiments of the present disclosure, the capacitance of the fourth capacitor C4 may be greater than the capacitance of the fifth capacitor C5; and the capacitance of the third capacitor C3 may be greater than the capacitance of the fifth capacitor C5. Similarly, in other embodiments, to simplify the manufacturing process, the capacitance of the fourth capacitor C4 may be equal to the capacitance of the fifth capacitor C5, and the capacitance of the third capacitor C3 may be equal to the capacitance of the fifth capacitor C5.

Based on any of the foregoing embodiments, in some embodiments of the present disclosure, as shown in FIGS. 3-6, the shift register may further include a fifth transistor M5 and a sixth transistor M6. The source of the fifth transistor M5 may be connected to the first voltage signal VGH1, the drain may be connected to the source of the fourth transistor M4, and the gate may be connected to the second node N2. The source of the sixth transistor M6 may be connected to the second voltage signal VGL1, the drain may be connected to the source of the fourth transistor M4, and the gate may be connected to the fourth node N4.

Because the first transistor M1 and the second transistor M2 may be output transistors, to ensure the stability of the output signal OUT, the output performance requirements of the first transistor M1 and the second transistor M2 may be relatively high, and the width-to-length ratio of the transistor channel region may be relatively large. The larger the width-to-length ratio of the channel region of the transistor, the stronger the output capability of the transistor. Thus, in some embodiments of the present disclosure, to improve the output performance of the first transistor M1 and the second transistor M2, the width-to-length ratio of the channel region of the first transistor M1 may be greater than that of the fifth transistor M5, and/or the width-to-length ratio of the channel region of the first transistor M1 may be greater than the width-to-length ratio of the channel region of the sixth transistor M6.

The working process of the shift register shown in FIG. 3 will be described below in conjunction with the sequence diagram of each signal in the shift register.

Figure 7:
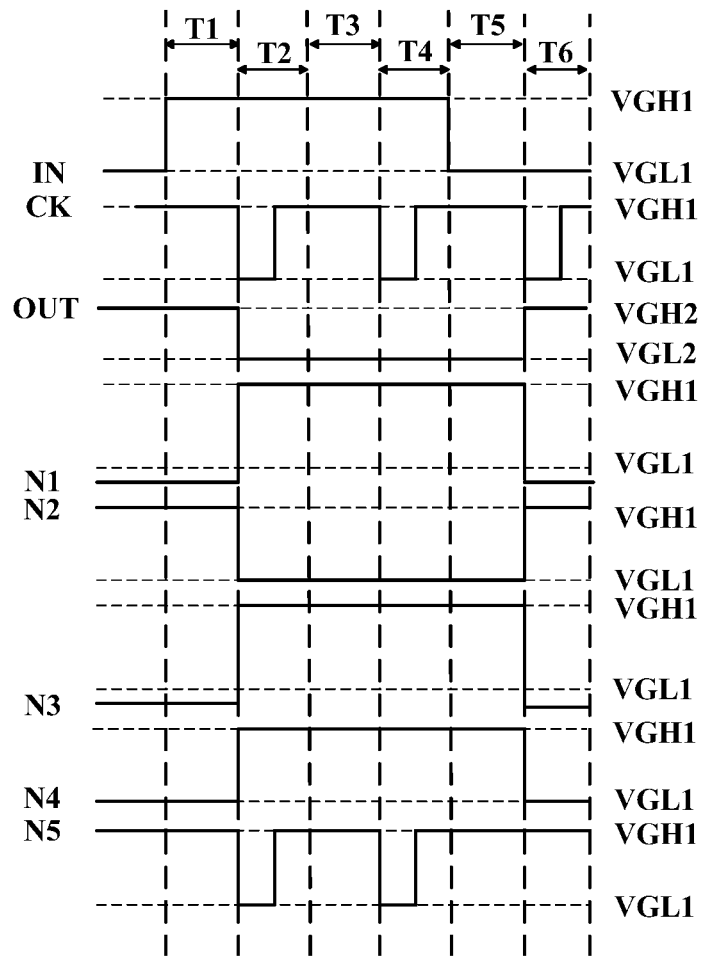
FIG. 7 illustrates a sequence diagram of each signal node of an exemplary shifter register consistent with various disclosed embodiments of the present disclosure.

FIG. 7 is an exemplary sequence diagram of the signal of each node in the shift register consistent with various disclosed embodiments of the present disclosure. As shown in FIG. 7, during the T1 period, the input signal IN may be at a high-level, the first clock signal CK may be at a high-level, and the first clock signal CK may be at a high-level. The seventh transistor M7 and the ninth transistor M5 may be turned off, the fifth node N5 may be maintained at a high-level, the first node N1 may be maintained at a low-level, and the tenth transistor M10 may be turned on to transmit the first voltage signal VGH1 to the second node N2. Thus, the second node N2 may be at a high-level. Accordingly, the fourth transistor M4, the fifth transistor M5, and the second transistor M2 may be turned off. Because the eleventh transistor M11 may always be open, the levels of the third node N3 and the first node N1 may be the same, and both at a low-level, the third transistor M3 may be turned on, and the second voltage signal VGL1 may be transmitted to the fourth node N4. Thus, the fourth node N4 may be a low-level, the first transistor M1 may be turned on, and the third voltage signal VGH2 may be transmitted to the output terminal such that the output signal OUT may be at a high-level.

In the T2 period, the input signal IN may be at a high-level, the first clock signal CK may be at a low-level, the seventh transistor M7 may be turned on, and the input signal IN may be transmitted to the first node N1. Thus, the first node N1 may be at a high-level, the third node N3 may be at a high-level, and the third transistor M3 may be turned off. Under the action of the fifth capacitor C5, the fifth node N5 may be at a low-level, and the eighth transistor M8 may be turned on to transmit the first clock signal CK to the second node N2 to cause the second node N2 to be at a low-level. The fourth transistor M4, the fifth transistor M5, and the second transistor M2 may be turned on, and the first voltage signal VGH1 may be transmitted to the fourth node N4. Thus, the fourth node N4 may be at a high-level, the first transistor M1 may be turned off, and the turned-on second transistor M2 may transmit the fourth voltage signal VGL2 to the output terminal such that the output signal OUT may be at a low-level.

In the T3 period, the input signal IN may be at a high-level, and the first clock signal CK may be at a high-level. Under the action of the fifth capacitor C5, the fifth node N5 may be at a high-level, the seventh transistor M7 may be turned off, and the first node N1 may be remained at a high-level, the third node N3 may be remained at a high-level, the eighth transistor M8 and the tenth transistor M10 may be turned off, the second node N2 may be remained at a low-level, the fourth node N4 may be remained at a high-level, the first transistor M1 may continue to be turned off, the second transistor M2 may continue to be turned on, and the output signal OUT may be at a low-level.

In the T4 period, the input signal IN may be at a high-level, the first clock signal CK may be at a low-level, the seventh transistor M7 may be turned on, and the input signal IN may be transmitted to the first node N1. Thus, the first node N1 may be maintained at a high-level, and the third node N3 may maintain a high-level. Under the action of the fifth capacitor C5, the fifth node N5 may be at a low-level, and the eighth transistor M8 may be turned on to transmit the first clock signal CK to the second node N2. Thus, the second node N2 may be maintained at a low-level, the fourth node N4 may be maintained at a high-level, and the output signal OUT may be maintained at a low-level.

In the T5 period, the input signal IN may be at a low-level, the first clock signal CK may be at a high-level, the seventh transistor M7 may be turned off, the first node N1 may be remained at a high-level, the third node N3 may be remained at a high-level, the ninth transistor M9 may be turned on, and the first voltage signal VGH1 may be transmitted to the fifth node N5. Thus, the fifth node N5 may be at a high-level such that the second node N2 may be maintained at a low-level, the fourth node N4 may be maintained at a high-level, and the output signal OUT may be maintained at a low-level.

In the T6 period, the input signal IN may be at a low-level, the first clock signal CK may be at a low-level, the seventh transistor M7 and the ninth transistor M9 may be turned on, and the input signal IN of the turned-on the seventh transistor M7 may be transmitted to the first node N1. Thus, the first node N1 may be at a low-level, and the third node N3 may be at a low-level. The turned-on ninth transistor M9 may transmit the first voltage signal VGH1 to the fifth node N5. Thus, the fifth node N5 may be at a high-level. The eighth transistor M8 may be turned off, and the turned-on tenth transistor M10 may transmit the first voltage signal VGH1 to the second node N2. Thus, the second node N2 may be at a high-level, the fourth transistor M4, the fifth transistor M5 and the second transistor M2 may be turned off, the third transistor M3 may be turned on, and the second voltage signal VGL1 may be transmitted to the fourth node N4. Thus, the fourth node N4 may be at a low-level. The turned-on first transistor M1 may transmit the third voltage signal VGH2 to the output terminal to cause the output signal OUT to be at a high-level.

Figure 8:
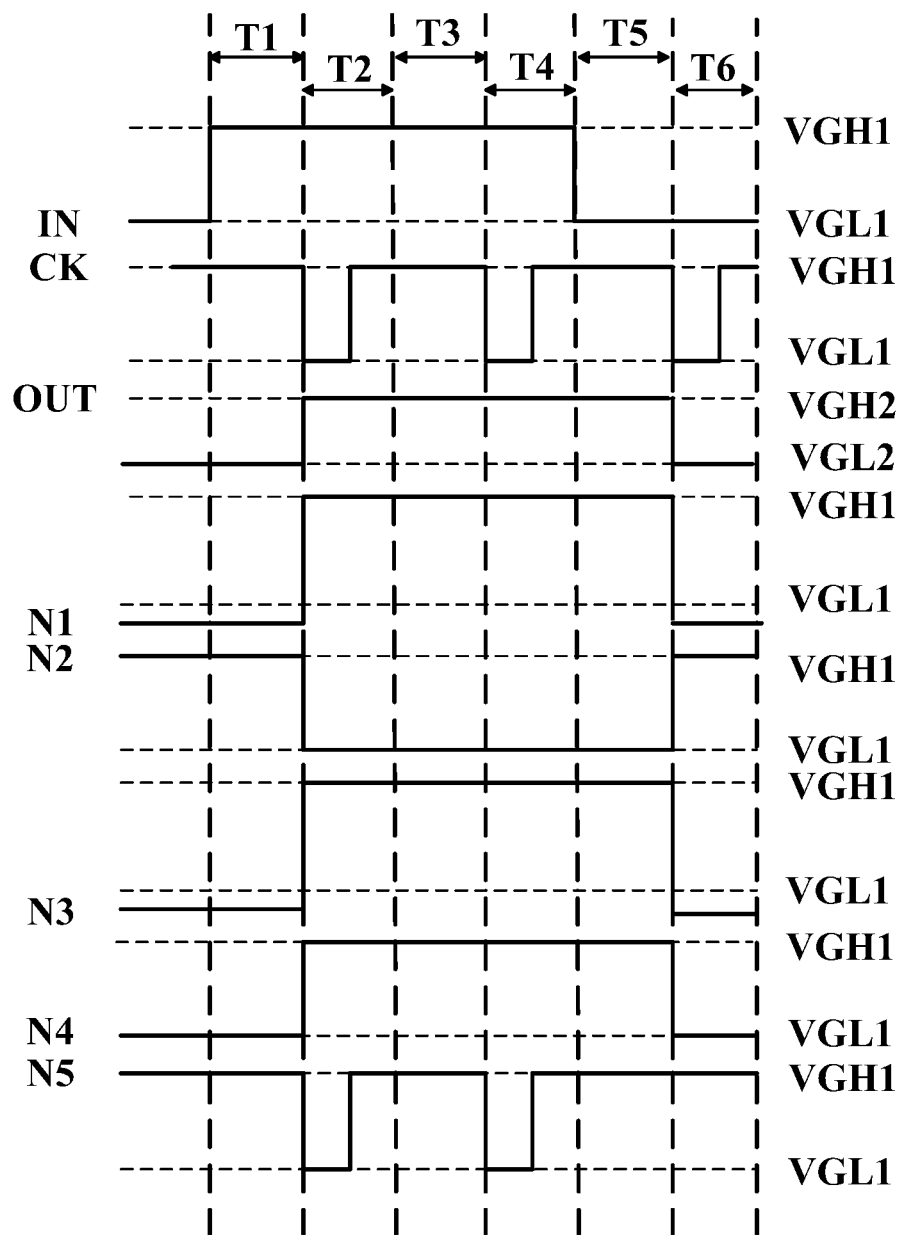
FIG. 8 illustrates a sequence diagram of each signal node of another exemplary shifter register consistent with various disclosed embodiments of the present disclosure.

It should be noted that, in the structure shown in FIG. 4, only the connection node of the first transistor M1 and the second transistor M2 is different from the connection node shown in FIG. 3. Thus, from the T1 period to the T6 period, the levels of the second node N2, the third node N3, the fourth node N4, and the fifth node N5 may all be same as the above process, and the difference may only be the level of the output signal OUT. As shown in FIG. 7, the level change state of the output signal OUT may be same as the level change state of the second node N2. FIG. 8 is another exemplary sequence diagram of the signal of each node in the shift register consistent with various disclosed embodiments of the present disclosure. As shown in FIG. 8, the level change state of the output signal OUT may be the same as the level change state of the fourth node N4.

In the structure shown in FIG. 5, although the types of the first transistor M1 and the second transistor M2 may be different from those of the first transistor M1 and the second transistor M2 shown in FIG. 3, the input voltage of the first transistor M1 in FIG. 5 may also be different from the voltage signal input by the first transistor M1 in FIG. 3, and the voltage signal input by the second transistor M2 in FIG. 5 may also be different from the voltage signal input by the second transistor M2 in FIG. 3. Thus, the level of the output signal OUT in FIG. 5 may be same as the level of the output signal OUT in FIG. 3. For example, the sequence diagram of the signal of each node in the structure shown in FIG. 5 may also be same as shown in FIG. 7.

In the structure shown in FIG. 6, the connection node of the first transistor M1 and the second transistor M2 may be different from the connection node shown in FIG. 5. Similarly, from the T1 period to the T6 period, only the level of the output signal OUT may be different. The sequence diagram of the signal of each node in the structure shown in FIG. 6 may be same as shown in FIG. 8.

It should be noted that, because the first transistor M1 and the second transistor M2 may generate the output signal OUT under the control of the fourth node N4 and the second node N2, respectively, the high-level signals of the second node N2 and the fourth node N4 and the low-level signals may be respectively the first voltage signal VGH1 and the second voltage signal VGL1. For example, the control signals of the fourth control unit 40 may be the first voltage signal VGH1 and the second voltage signal VGL1, and the received signals of the fourth control unit 40 may be the third voltage signal VGH2 and the fourth voltage signal VGL2. Thus, when the potential of the first voltage signal VGH1 is higher than the potential of the third voltage signal VGH2, and/or, the potential of the second voltage signal VGL1 is lower than the potential of the fourth voltage of the signal VGL2, the control signal of the fourth control unit 40 may have a level higher or a lower than the received signals.

For the first transistor M1 and the second transistor M2 of the PMOS, when a low-level signal is received, and the level of the control signal is lower than the received low-level signal, the PMOS transistors may be ensured to work at a relatively saturated state. Accordingly, the stability of the output signal OUT may be ensured; and the tailing phenomenon of the signal output may be reduced. Further, when the control signal is at a higher high-level, if the signal received by the PMOS transistor is also at a high-level, the PMOS transistor may be fully ensured to be turned off, and the risk of leakage may be fully reduced. Thus, in the embodiment of the present disclosure, the stability of the output waveform may be significantly improved to avoid problems such as tailing and leakage current.

Similarly, for the first transistor M1 and the second transistor M2 of the NMOS, when receiving a high-level signal, and the level of the control signal is higher than the received high-level signal, the NMOS transistor may be ensured to work at a relatively saturated state. Thus, the stability of the output signal OUT may be ensured and the tailing phenomenon of the signal output may be reduced. Further, when the control signal is at a lower low-level, if the signal received by the NMOS transistor is also at a low-level, the NMOS transistor may be fully ensured to be turned off, and the risk of leakage may be significantly reduced. Thus, in the embodiment of the present disclosure, the stability of the output waveform may be significantly improved, and the problems such as tailing and leakage current may be avoided.

Based on the structures shown in FIGS. 3 and 4, in some embodiments of the present disclosure, the width-to-length ratio of the channel region of the second transistor M2 may be greater than or equal to the width-to-length ratio of the channel region of the first transistor M1.

Because the second transistor M2 may be a transistor connected to the fourth voltage signal VGL2, when the fourth voltage signal VGL2 is transmitted to the output terminal such that the output signal OUT is at a low-level, the potential of the second node N2 may be at a low-level. For the PMOS transistor, when the source and the gate are at the same low potential, to ensure the stability of the low-level signal output by the PMOS transistor, i.e., the output signal OUT, it may be necessary to increase the output capacity of the PMOS transistor as much as possible. Because the larger the width-to-length ratio of the channel region of the PMOS transistor, the stronger the output capability of the PMOS transistor, it may be necessary to appropriately increase the width-to-length ratio of the channel region of the PMOS transistor.

For the first transistor M1, the third voltage signal VGH2 connected to it may be a high-level signal. When the fourth node N4 is at a low-level, the PMOS transistor may work at a relatively saturated state and may be fully turned on. Thus, its output capability requirement may be smaller than that of the second transistor M2, and its width-to-length ratio may be appropriately set smaller.

Based on such a condition, in some embodiments of the present disclosure, the width-to-length ratio of the channel region of the second transistor M2 may be made larger than that of the channel region of the first transistor M1. Similarly, to simplify the manufacturing process, the width-to-length ratio of the channel region of second transistor M2 may also be made to be equal to the width-to-length ratio of the channel region of the first transistor M1.

Based on the structures shown in FIGS. 5-6, in some embodiments of the present disclosure, the width-to-length ratio of the channel region of the second transistor M2 may also be greater than or equal to that of the channel region of the first transistor M1. The reason for the width-to-length ratio may be similar to the above description.

Based on the structures shown in FIGS. 3-4, in some embodiments of the present disclosure, the capacitance of the first capacitor C1 may be less than or equal to the capacitance of the second capacitor C2.

Because the second capacitor C2 may be connected to the fourth voltage signal VGL2, and the first capacitor C1 may be connected to the third voltage signal VGH2, for the fourth voltage signal VGL2, when it is transmitted to the output terminal to form the output signal OUT, the second node N2 connected to the gate of the second transistor M2 may be at a low-level. For PMOS transistors, when the gate and the source are both low-level signals, the output of the PMOS transistor may be likely to be unstable. Thus, a sufficiently large second capacitor C2 may be used to ensure the stability of the potential of the second node N2. For the first transistor M1, when its gate is at a low-level, its source may be the third voltage signal VGH2, which is a high-level signal. Thus, it may not be prone to have the problem of unstable output. Accordingly, it may not need a large enough first capacitor C1 to ensure the stability of the fourth node N4.

Based on such a condition, in some embodiments of the present disclosure, the capacitance of the first capacitor C1 may be made smaller than the capacitance of the second capacitor C2. Similarly, to simplify the manufacturing process, in other embodiments, the capacitance of the first capacitor C1 may be equal to the capacitance of the second capacitor C2.

Based on the structures shown in FIG. 5 and FIG. 6, in some embodiments of the present disclosure, the capacitance of the first capacitor C1 may also be less than or equal to the capacitance of the second capacitor C2.

Figure 9:
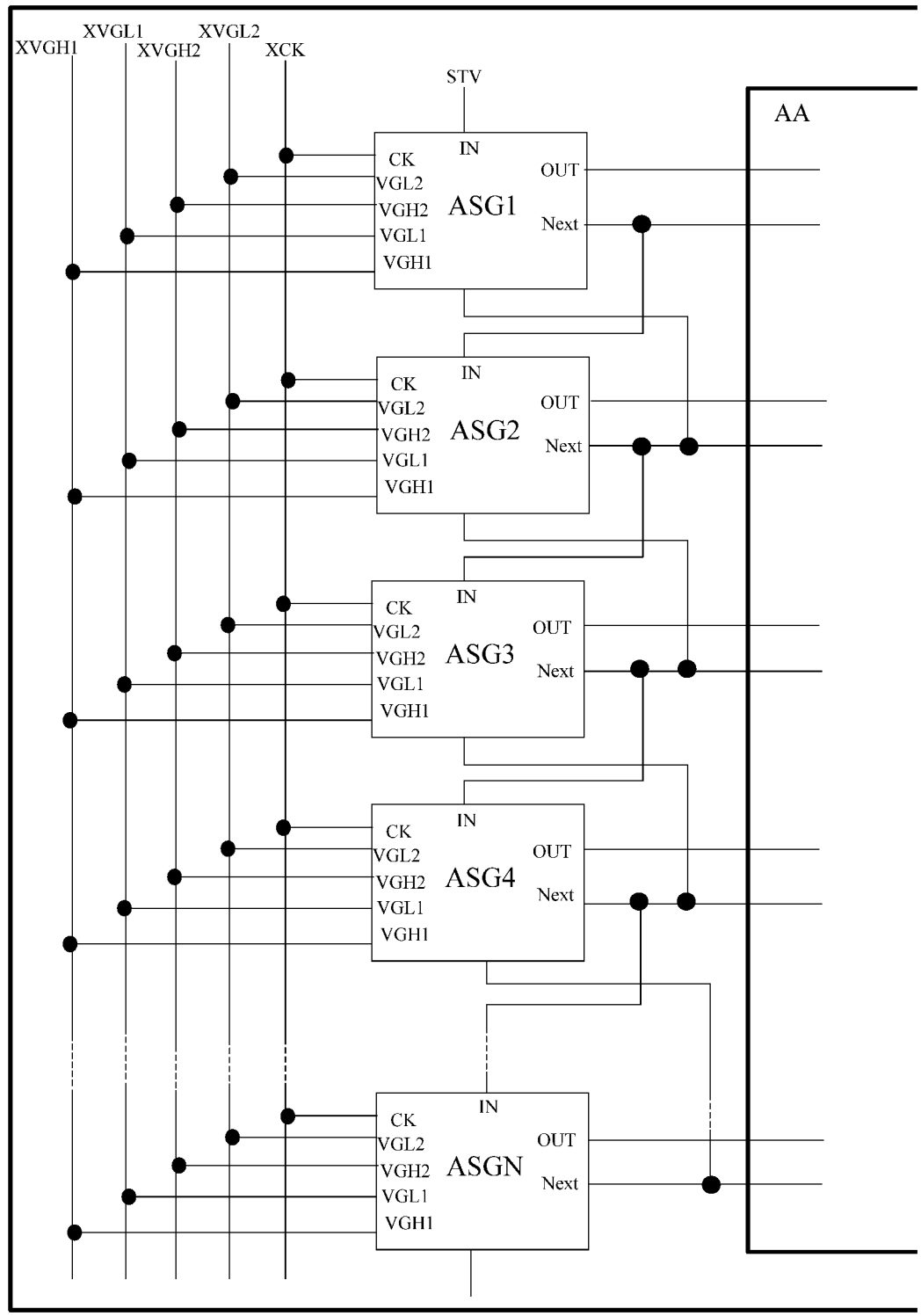
FIG. 9 illustrates an exemplary driving circuit consistent with various disclosed embodiments of the present disclosure.

FIG. 9 is a schematic structural diagram of an exemplary driving circuit consistent with various disclosed embodiments of the present disclosure. As shown in FIG. 9, the driving circuit may include N levels of shift registers. For example, the driving circuit may include N cascaded shift registers ASG1 to ASGN. In some embodiments of the present disclosure, the signal of the fourth node N4 of the M-th level shift register may be connected to the input signal terminal of the (M+1)-th level shift register as the input signal of the (M+1)-th level shift register, $1 \leq M \leq M+1 \leq N$, and $N \geq 2$.

For example, the signal Next of the fourth node N4 of the shift register of the previous level may be used as the input signal IN of the shift register of the next level, and the output signal OUT of the shift register of each level may be input to the pixel circuit as a driving signal. In other embodiments, as shown in FIG. 8, when the change state of the output signal OUT is the same as the change state of the fourth node N4, the output signal OUT of the M-th level shift register may also be used as the input signal IN of the (M+1)-th level shift register, and the signal Next of the fourth node N4 may be input to the pixel circuit as a driving signal.

In some embodiments of the present disclosure, as shown in FIG. 9, the display panel may further include a first voltage signal line XVGH1 configured to provide the first voltage signal VGH1 for the driving circuit; a second voltage signal line XVGL1 configured to provide the second voltage signal VGL1 for the driving circuit; a third voltage signal line XVGH2 configured to provide a third voltage signal VGH2 for the driving circuit; and a fourth voltage signal line XVGL2 configured to provide a fourth voltage signal VGL2 for the driving circuit.

Because the third voltage signal VGH2 and the fourth voltage signal VGL2 may be used to generate the output signal OUT, and the output signal OUT may be used to provide a driving signal for the pixel circuit 130 of the display area AA of the display panel, to save the space of the driving circuit 11 as much as possible and avoid excessively long wiring, the third voltage signal VGH2 and the fourth voltage signal VGL2 may be located on the side adjacent to the display area AA.

Based on such a consideration, in some embodiments of the present disclosure, at least one of the third voltage signal line XVGH2 and the fourth voltage signal line XVGL2 may be disposed a side of at least one of the first voltage signal line XVGH1 and the second voltage signal line XVGL1 facing the display area of the display panel.

In some embodiments of the present disclosure, as shown in FIG. 9, the first voltage signal line XVGH1, the second voltage signal line XVGL1, the third voltage signal line XVGH2, and the fourth voltage signal line XVGL2 may all be disposed at a side of the driving circuit away from the display area AA of the display panel. Further, the third voltage signal line XVGH2 and the fourth voltage signal line XVGL2 may both be disposed at the side of the first voltage signal line XVGH1 and the second voltage signal line XVGL1 adjacent to the display area AA or toward the display area AA of the display panel. Such a configuration may maximize the saving of the space of the driving circuit 11, and the wiring length may be reduced.

Figure 10:
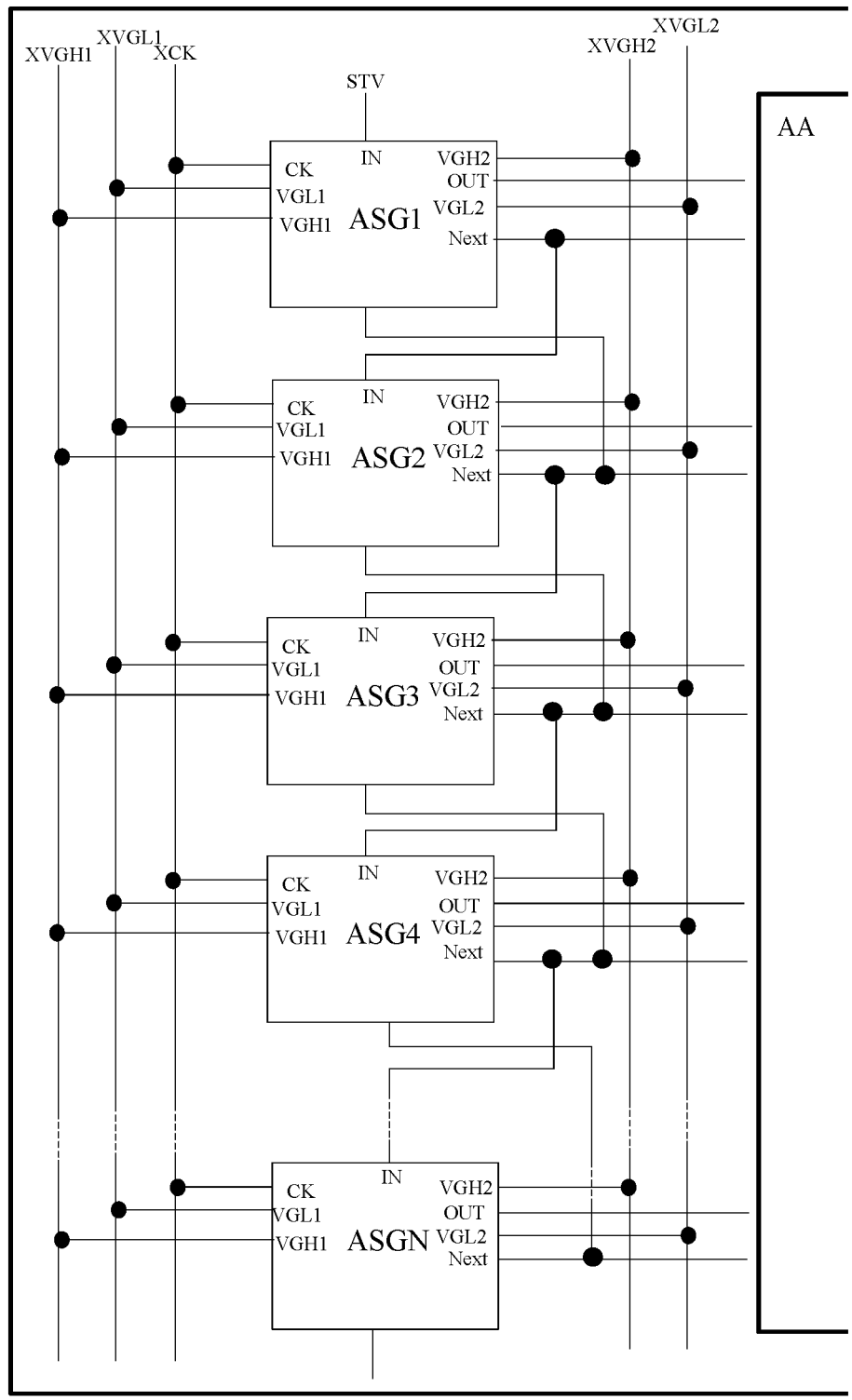
FIG. 10 illustrates another exemplary driving circuit consistent with various disclosed embodiments of the present disclosure.

FIG. 10 is a schematic structural diagram of another exemplary driving circuit consistent with various disclosed embodiments of the present disclosure. As shown in FIG. 10, the first voltage signal line XVGH1 and the second voltage signal line XVGL1 may be located at the side of the driving circuit away from the display area AA of the display panel; and the third voltage signal line XVGH2 and the fourth voltage signal line XVGL2 may be located at the side of the driving circuit facing the display area AA of the display panel. Such a configuration may further save the space of the driving circuit 11; and the wiring length may be reduced.

Because the potential of the first voltage signal VGH1 may be higher than the potential of the third voltage signal VGH2, and/or the potential of the second voltage signal VGL1 may be lower than the potential of the fourth voltage signal VGL2, the voltage value carried on the first voltage signal line XVGH1 and the second voltage signal XVGL1 may be higher. If its line width is relatively small, the resistance may be relatively large, and the voltage loss on the signal line may be relatively large. Therefore, in some embodiments of the present disclosure, the line width of at least one of the first voltage signal line XVGH1 and the second voltage signal line XVGL1 may be greater than the line width of at least one of the third voltage signal line XVGH2 and the fourth voltage signal line XVGL2.

Figure 11:
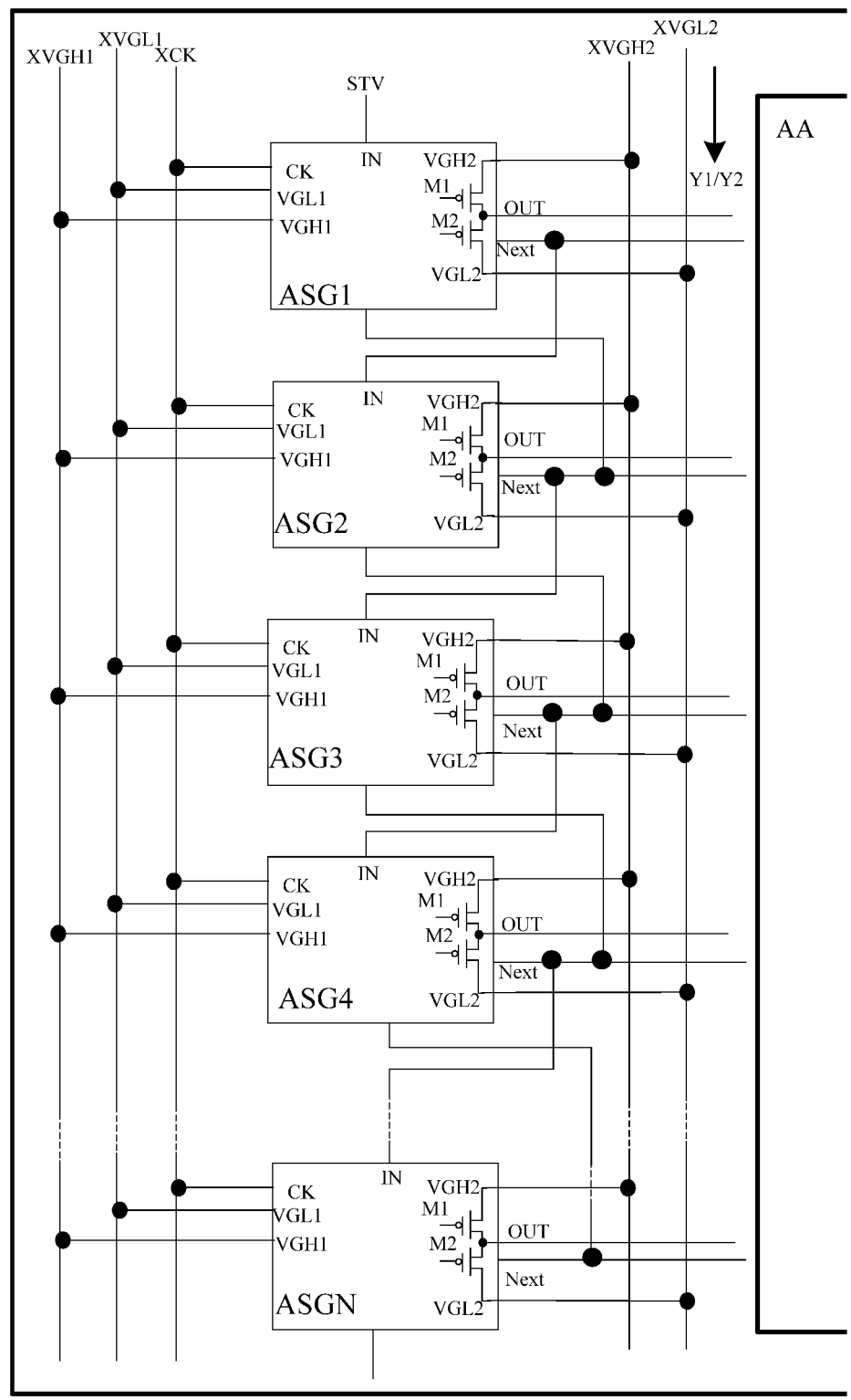
FIG. 11 illustrates another exemplary driving circuit consistent with various disclosed embodiments of the present disclosure.

FIG. 11 is a schematic structural diagram of an exemplary driving circuit consistent with various disclosed embodiments of the present disclosure. Because the first transistor M1 and the second transistor M2 may generate the output signal OUT, and the first transistor M1 and the second transistor M2 may generally be transistors with a relatively large width and length, to further reduce the bezel of the display panel and the space of the driving circuit 11, as shown in FIG. 11, in some embodiments of the present disclosure, the shift registers may be cascaded with each other along a first direction Y1, and the first transistor M1 and the second transistors M2 may be arranged along a second direction Y2. The first direction Y1 may be parallel to the second direction Y2.

In some embodiments of the present disclosure, as shown in FIG. 1, the display panel may include a pixel circuit 130, the driving circuit 11 may provide a first driving signal to the pixel circuit 130 through a first driving signal line 110, and the first driving signal may be the output signal OUT.

Figure 12:
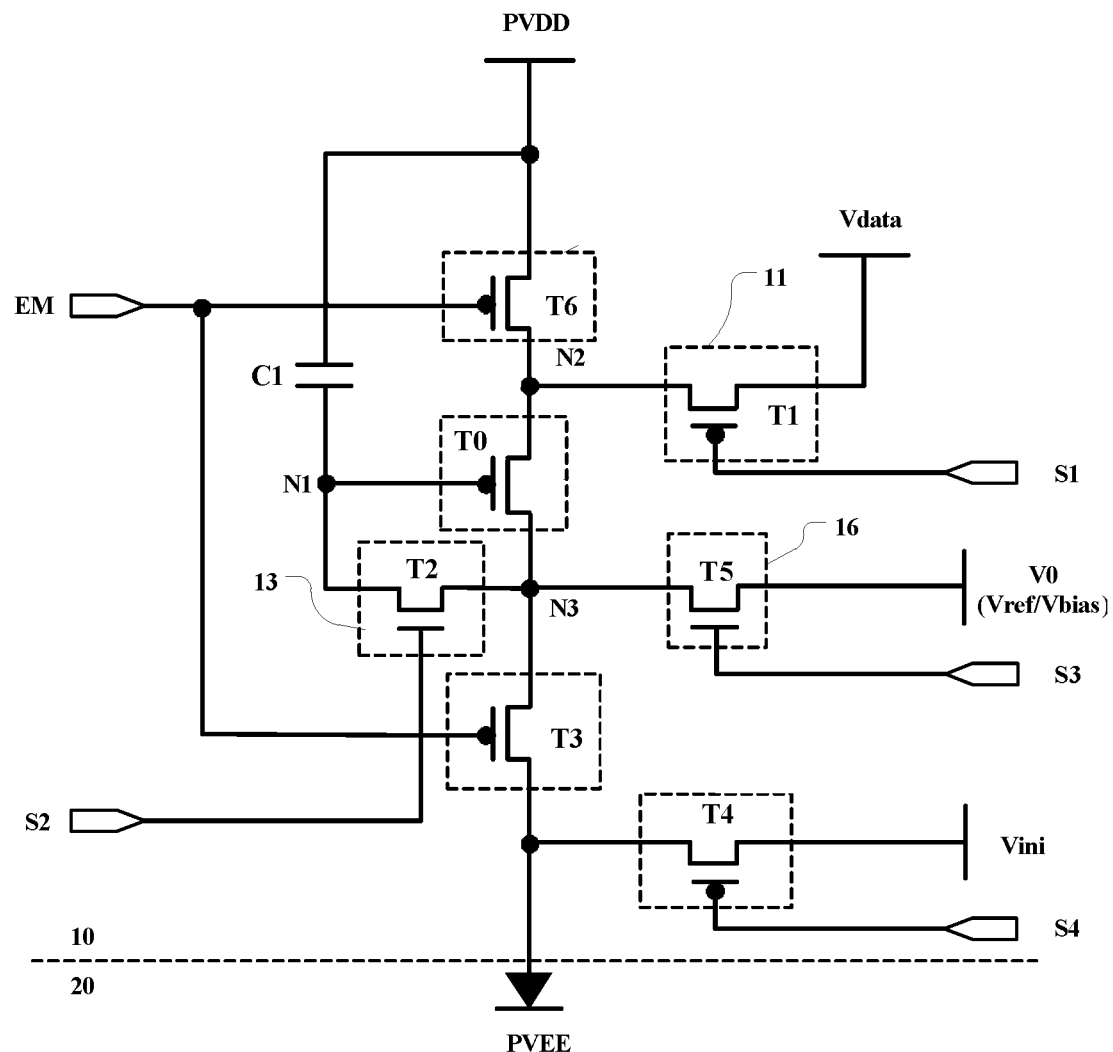
FIG. 12 illustrates an exemplary pixel circuit consistent with various disclosed embodiments of the present disclosure.
Figure 13:
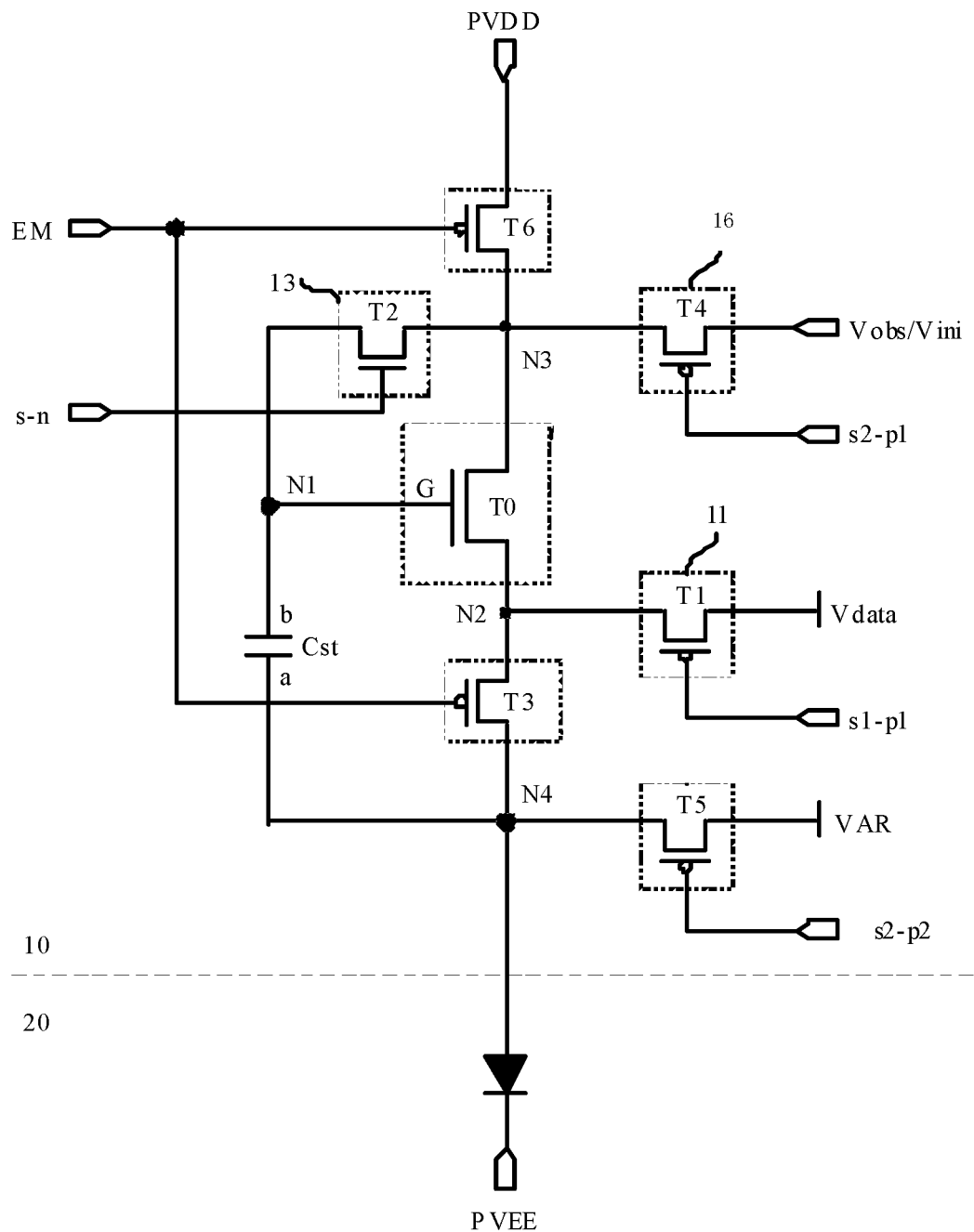
FIG. 13 illustrates another exemplary pixel circuit consistent with various disclosed embodiments of the present disclosure.

FIG. 12 is a schematic structural diagram of an exemplary pixel circuit consistent with various disclosed embodiments of the present disclosure, and FIG. 13 is a schematic structural diagram of another exemplary pixel circuit consistent with various disclosed embodiments of the present disclosure. As shown in FIGS. 12-13, the pixel circuit 130 may include a driving transistor T0.

The driving transistor T0 in FIG. 12 may be a PMOS transistor, and the driving transistor T0 in FIG. 13 may be an NMOS transistor. The pixel driving circuit may also include other transistors T1 to T6 and other signal input terminals.

The gate of the driving transistor T0 may be coupled to the first driving signal line 110. The first driving signal, that is, the output signal OUT of the shift register, may be configured to selectively reset the gate of the driving transistor T0 to initialize the gate of the driving transistor T0.

The output signal OUT of the shift register may be V0 (Vref/Vbias) in FIG. 12. When the transistors T5 and T2 are turned on, the output signal OUT of the shift register, e.g., V0 (Vref/Vbias), may be transmitted to the gate of the driving transistor T0 to reset the gate of the driving transistor T0.

The output signal OUT of the shift register may be V0 (Vobs/Vin) in FIG. 13. When the transistors T4 and T2 are turned on, the output signal OUT of the shift register, e.g., Vobs/Vini, may be transmitted to the gate of the driving transistor T0 to reset the gate.

When the driving transistor T0 is a PMOS transistor, the gate reset may be mainly to give a low-level signal to the gate. However, to achieve high-frequency refresh of the display panel, the gate reset signal should not be too low to shorten the charging time of the first node N1 in FIG. 12 and FIG. 13 in the data writing phase. Thus, the absolute value VGL2 of the voltage of the fourth voltage signal VGL2 may need to be set smaller. The absolute value of the voltage VGH2 of the third voltage signal VGH2 may correspond to the non-reset phase, which may require a relatively high-level to ensure that the gate of the driving transistor T0 is protected from the effect of the signal during the non-reset phase. Thus, for PMOS transistors, VGH2 may be appropriately set higher. For NMOS transistors, the level situation may be exactly the opposite, but the principle may be the same.

Based on such a condition, in some embodiments of the present disclosure, the driving transistor T0 may be a PMOS transistor, then $|V_{GH1}-V_{GH2}| \le |V_{GL1}-V_{GL2}|$; the driving transistor T0 may be an NMOS transistor, then $|V_{GH1}-V_{GH2}| \ge |V_{GL1}-V_{GL2}|$. The absolute value of the voltage of the first voltage signal VGH1 may be $V_{GH1}$, the absolute value of the voltage of the second voltage signal VGL1 may be $V_{GL1}$, the absolute value of the third voltage signal VGH2 may be $V_{GH2}$, and the absolute value of the fourth voltage signal VGL2 is $V_{GL2}$.

Furthermore, for PMOS transistors, if $|V_{GL1}-V_{GL2}| \geq V_{GL2}$, for example, $V_{GL1}$ is 7V and $V_{GL2}$ is only 3V, then $|V_{GL1}-V_{GL2}|$ is larger than $V_{GL2}$. Thus, in the reset phase, the potential of the gate of drive transistor T0 may not be too low, which may ensure the smooth operation of the driving transistor T0. For NMOS transistors, the level situation may be just the opposite, but the principle may be the same.

Based on such a condition, in some embodiments of the present disclosure, the driving transistor is a PMOS transistor, then $|V_{GH1}-V_{GH2}| \leq V_{GH2}$, and $|V_{GL1}-V_{GL2}| \geq V_{GL2}$. In other embodiments, the driving transistor is an NMOS transistor, then $|V_{GH1}-V_{GH2}| \geq V_{GH2}$, and $|V_{GL1}-V_{GL2}| \leq V_{GL2}$.

As shown in FIGS. 12-13, the pixel circuit may include a data writing module 11, a compensation module 13, and a reset module 16. The data writing module 11 may be connected to the source of the driving transistor T0; the compensation module 13 may be connected between the gate and the drain of the driving transistor T0; and the reset module 16 may be connected to the drain of the driving transistor T0.

The working process of the pixel circuit may include a reset phase and a bias phase. In the reset phase, the reset module 16 and the compensation module 13 may be both turned on, and the gate of the driving transistor T0 may receive a reset signal. In the bias phase, the reset module 16 may be turned on, the compensation module 13 may be turned off, and the drain of the driving transistor T0 may receive the bias signal.

When the output signal OUT of the shift register is V0 ($V_{ref}/V_{bias}$) in FIG. 12, in the reset phase, the output signal OUT may be the reset signal used to reset the gate of the driving transistor T0; and in the bias phase, the reset module 16 may be turned on, and the output signal OUT may be the bias signal used to charge the third node N3 in FIG. 12 to cause the potential of the third node N3 in FIG. 12 to be higher than the potential of the first node N1 in FIG. 12 to prevent the driving transistor T0 from having a leaking current flowing from the first node N1 to the third node N3. The leakage current may cause the potential of the first node N1 to drop, which may be affect the display function of the display panel.

When the output signal OUT of the shift register is $V_{obs}/V_{ini}$ in FIG. 13, in the reset phase, the output signal OUT may be the reset signal used to reset the gate of the driving transistor T0; and in the bias phase, the output signal OUT may be the bias signal used to adjust the potential of the third node N3 in FIG. 13 to cause the potential of the third node N3 in FIG. 13 to be lower than the potential of the first node N1 in FIG. 13. The difference from FIG. 12 may be that the levels of the reset signal and the bias signal may be different.

On such a basis, in some embodiments of the present disclosure, the driving transistor may be a PMOS transistor, as shown in FIG. 12, the reset signal may be the fourth voltage signal VGL2, and the bias signal may be a third voltage signal VGH2. In other words, the reset signal may be the output signal OUT generated by the fourth voltage signal VGL2, and the bias signal may be the output signal OUT generated by the third voltage signal VGH2.

During the light-emitting stage of the pixel circuit shown in FIG. 12, there may be a situation where the potential of the gate of the driving transistor T0 at the first node N1 may be higher than the potential of the drain at the third node N3. For example, the potential at the second node N2 may be 4.6V, the potential at the first node N1 may be 3V, and the potential at the third node N3 may be 1V. For PMOS transistors, if such a condition continues for a relatively long time, the stability of PMOS transistors may be affected. Thus, it may be necessary to set a bias stage in the non-light-emitting phase, and the potential of the third node N3 may be raised through the bias signal to eliminate such an effect in the light-emitting phase. To fully realize such a process, the high-level signal VGH2 of the bias signal may need to be as high as possible, while the low-level signal VGL2 of the reset signal may not need to be set too low. Thus, $|V_{GH1}-V_{GH2}| \leq |V_{GL1}-V_{GL2}|$.

In other embodiments, the driving transistor may be an NMOS transistor, as shown in FIG. 13, the reset signal may be the third voltage signal VGH2, and the bias signal may be the fourth voltage signal VGL2. In other words, the reset signal may be the output signal OUT generated by the third voltage signal VGH2, and the bias signal may be the output signal OUT generated by the fourth voltage signal VGL2.

During the light-emitting stage of the pixel circuit shown in FIG. 13, there may be a situation where the potential of the gate of the driving transistor T0 at the first node N1 may be lower than the potential of the drain at the third node N3. For example, the potential at the third node N3 may be 4.6V and the potential at the first node N1 may be 3V. For NMOS transistors, when such a condition continues for a relatively long time, the stability of the NMOS transistor may be affected. Thus, it may be necessary to set a bias stage in the non-light-emitting stage, and the potential of the third node N3 may be pulled down by the bias signal to eliminate the above-mentioned influence in the light-emitting stage. To achieve such a process, the low-level signal $V_{GL2}$ of the bias signal may need to be as low as possible, while the high-level signal $V_{GH2}$ of the reset signal may not need to be set too low. Thus, $|V_{GH1}-V_{GH2}| \geq |V_{GL1}-V_{GL2}|$.

Figure 14:
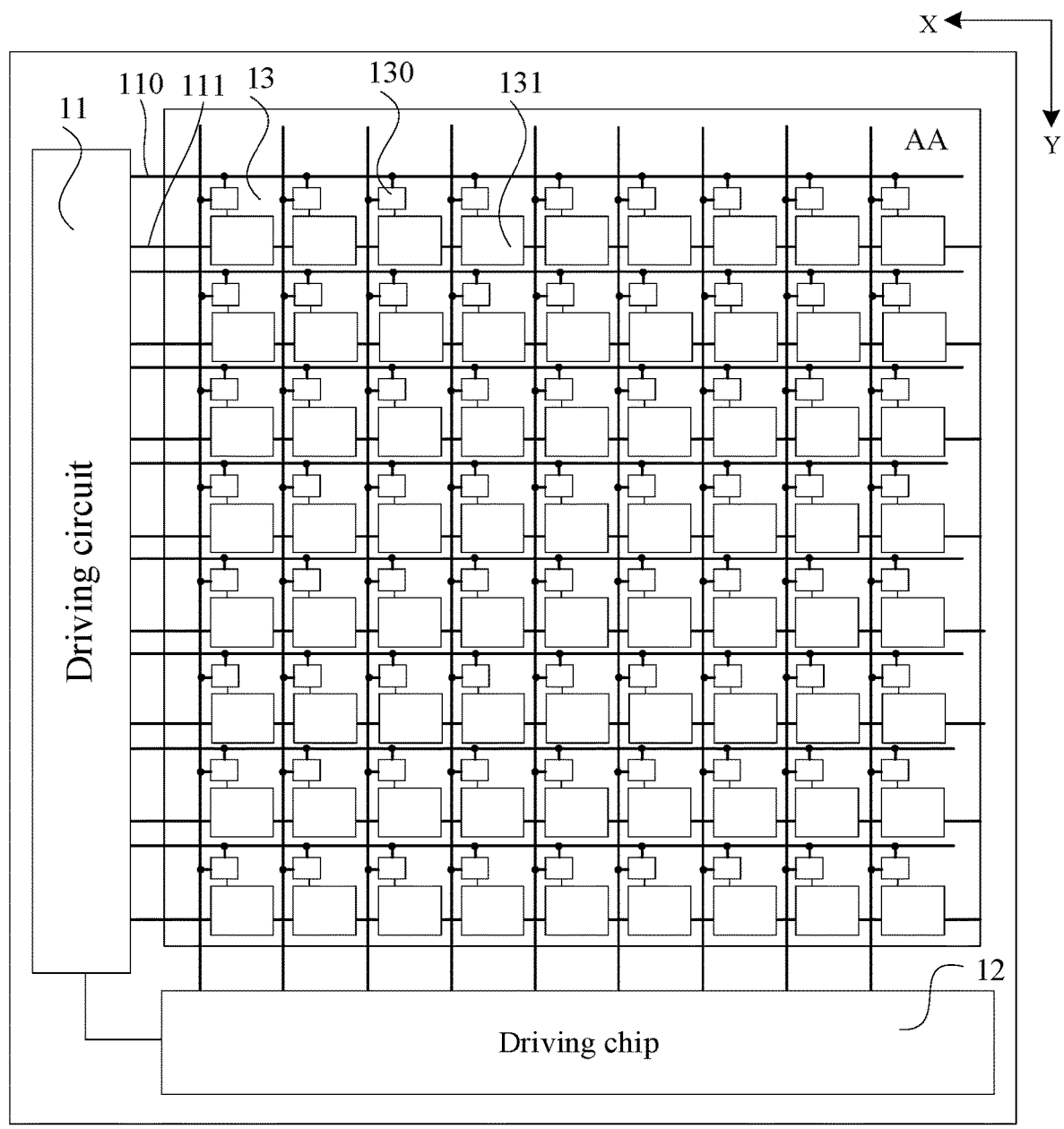
FIG. 14 illustrates a top view of another exemplary display panel consistent with various disclosed embodiments of the present disclosure.

FIG. 14 is a schematic top view of another exemplary display panel consistent with various disclosed embodiment of the present disclosure. As shown in FIG. 14, the display panel may further include a light-emitting element 131, and the driving circuit 11 may provide a second driving signal to the light-emitting element 131 through the second driving signal line 111. The second driving signal may be the output signal OUT.

The light-emitting element 131 may include a cathode, an anode, and a light-emitting layer between the cathode and the anode. The light-emitting layer may be driven to emit light through the cathode and the anode. In some embodiments of the present disclosure, the anode of the light-emitting element 131 may be coupled to the second driving signal line 111, and the second driving signal line 111 may be used to selectively reset the light-emitting element 131 to initialize the light-emitting element 131.

Because the reset signal of the anode of the light-emitting element 131 may generally be at a low-level, in some embodiments of the present disclosure, $|V_{GH1}-V_{GH2}| \leq |V_{GL1}-V_{GL2}|$. Further, because the reset signal may not be too low in some application scenarios, in some embodiments of the present disclosure, $|V_{GH1}-V_{GH2}| \leq V_{GH2}$, and $|V_{GL1}-V_{GL2}| \geq V_{GL2}$.

The absolute value of the voltage of the first voltage signal VGH1 may be $V_{GH1}$, the absolute value of the voltage of the second voltage signal VGL1 is $V_{GH1}$, the absolute value of the third voltage signal VGH2 may be $V_{GH2}$, and the absolute value of the fourth voltage signal VGL2 is $V_{GL2}$.

Figure 15:
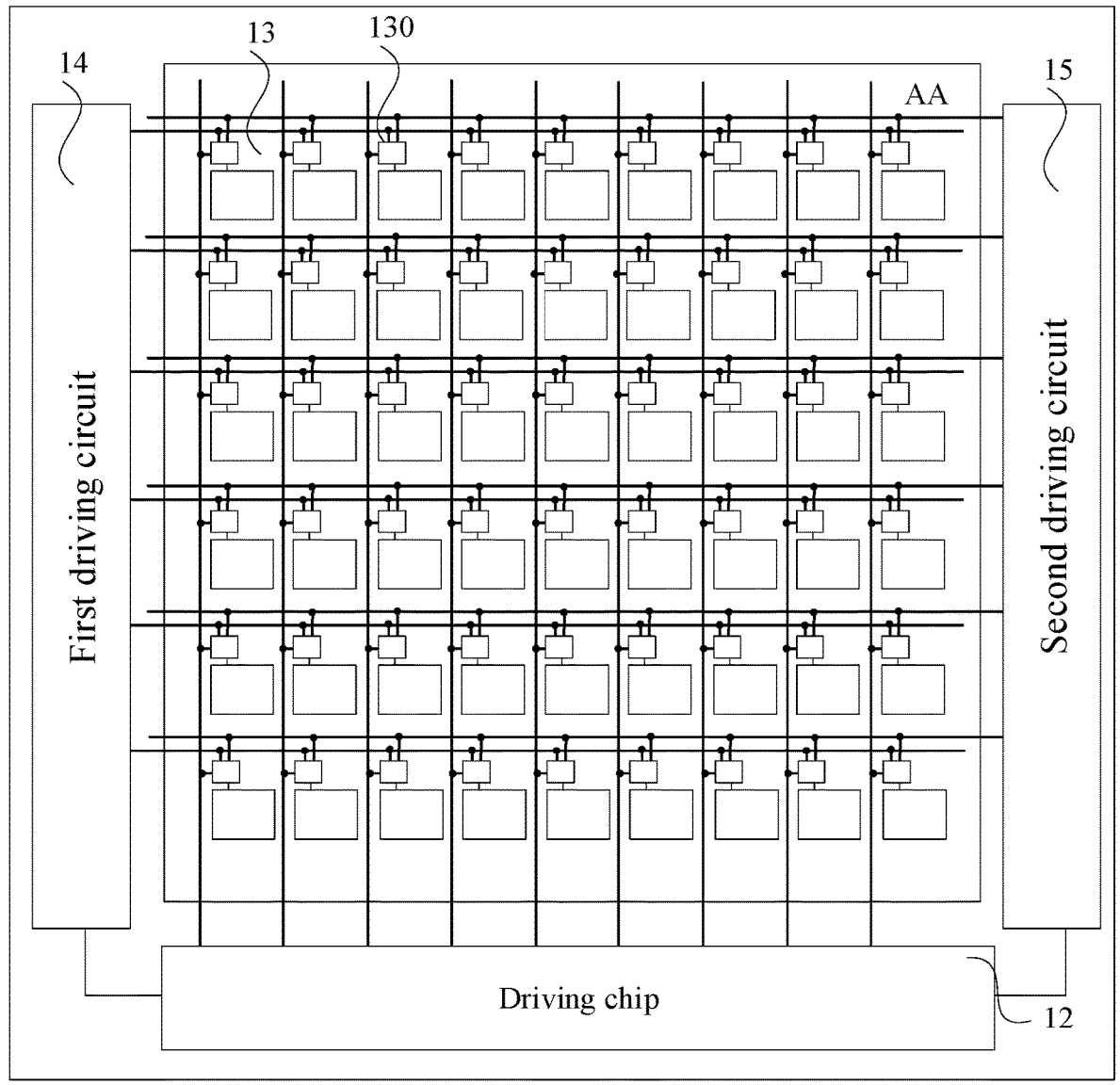
FIG. 15 illustrates a top view of another exemplary display panel consistent with various disclosed embodiments of the present disclosure.

In the above embodiments, only the display panel including one driving circuit is used as an example for description. In other embodiments, the display panel may include more than one driving circuit. FIG. 15 illustrates a schematic top view of another exemplary display panel consistent with various disclosed embodiments of the present disclosure.

As shown in FIG. 15, the display panel may include a first driving circuit 14 and a second driving circuit 15. The first driving circuit 14 may include N1 levels of shift registers cascaded with each other, and the second driving circuit 15 may include N2 levels of shift registers cascaded with each other. N1≥2, and N2≥2.

In some embodiments of the present disclosure, the potential of at least one of the third voltage signal VGH2 in the first driving circuit 14 and the third voltage signal VGH2 in the second driving circuit 15 may be higher than the potential of the other; and/or the potential of at least one of the fourth voltage signal VGL2 in the first driving circuit 14 and the fourth voltage signal VGL2 in the second driving circuit 15 is lower than the potential of the other. Such a configuration may allow the output signal OUT of the first driving circuit 14 to be different from the output signal OUT of the second driving circuit 15 to meet different voltage requirements of different signals in the pixel circuit 130.

In some embodiments of the present disclosure, the display panel may further include a pixel circuit 130. The first driving circuit 14 may provide a third driving signal for the pixel circuit 130, and the second driving circuit 15 may provide a fourth driving signal for the pixel circuit 130. For example, the output signal OUT generated by the first driving circuit 14 may be the third driving signal of the pixel circuit 130, and the output signal OUT generated by the second driving circuit 15 may be the fourth driving signal of the pixel circuit 130. The third driving signal and the fourth driving signal may be different driving signals, such as reset signals with different voltages, to meet the different voltage requirements of different signals in the pixel circuit 130. In other embodiments, the third driving signal and the fourth driving signal may also be signals with different time sequences to provide the pixel circuit 130 with two signals with different time sequences. For example, one of the third drive signal and the fourth drive signal may be a reset signal, and the other may be a scan signal.

Figure 16:
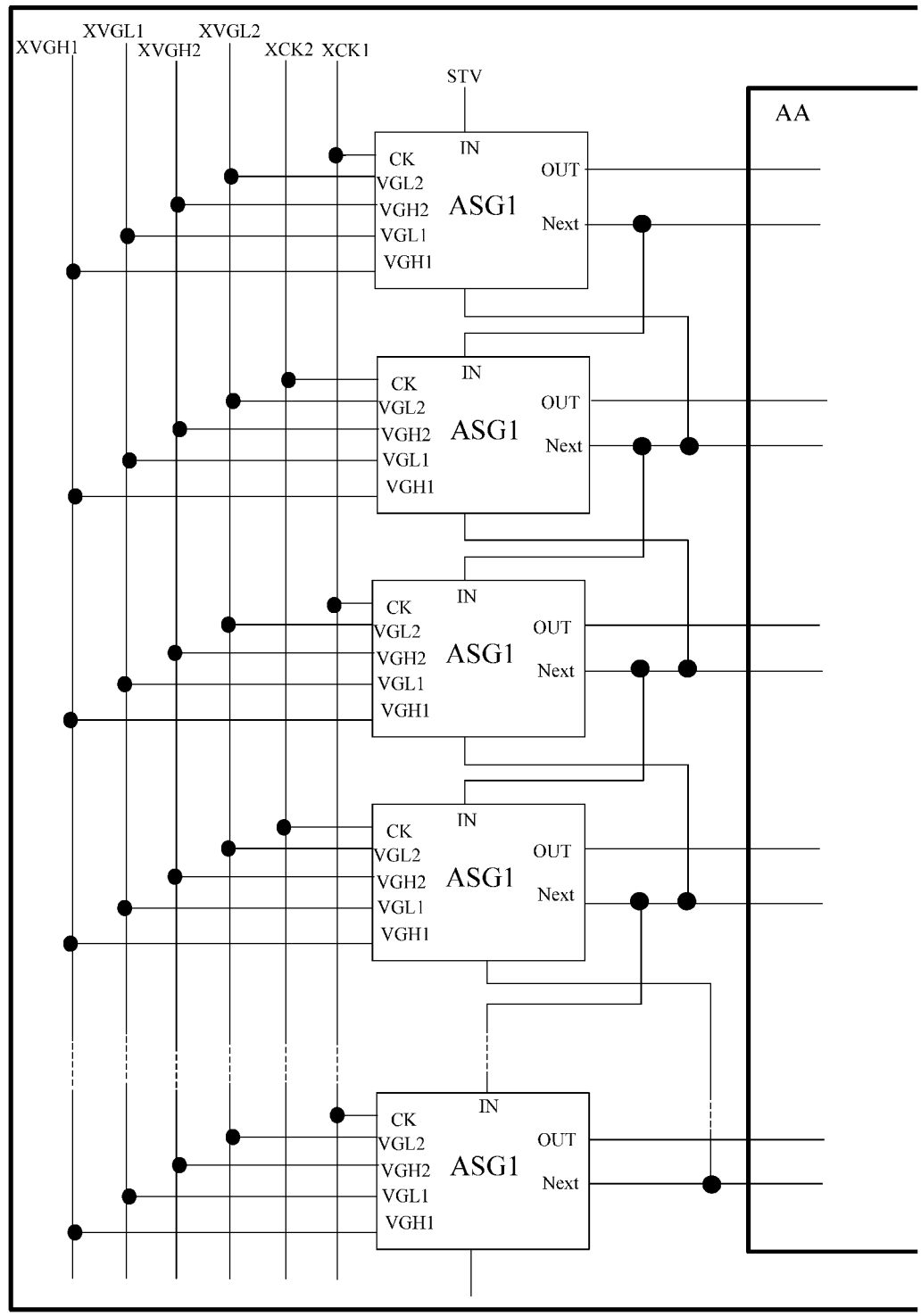
FIG. 16 illustrates an internal structure of another exemplary driving circuit consistent with various disclosed embodiments of the present disclosure.

FIG. 16 is a schematic diagram of the internal structure of another exemplary driving circuit consistent with various disclosed embodiments of the present disclosure. As shown in FIG. 16, in other embodiments of the present disclosure, the shift register may include a first shift register and a second shift register. The first clock signal may include a first sub-clock signal and a second sub-clock signal.

The first sub-clock signal may be provided by the first clock signal line XCK1, and the second sub-clock signal may be provided by the second clock signal line XCK2. For example, the clock signal input terminal CK of the first shift register may be connected to the first clock signal line XCK1 to receive the first sub-clock signal provided by the first clock signal line XCK1. Further, the first shift register may control the potentials of the first node N1 and the second node N2 in response to the first sub-clock signal. The clock signal input terminal CK of the second shift register may be connected to the second clock signal line XCK2 to receive the second sub-clock signal provided by the second clock signal line XCK2. The second shift register may control the potentials of the first node N1 and the second node N2 in response to the second sub-clock signal.

Figure 17:
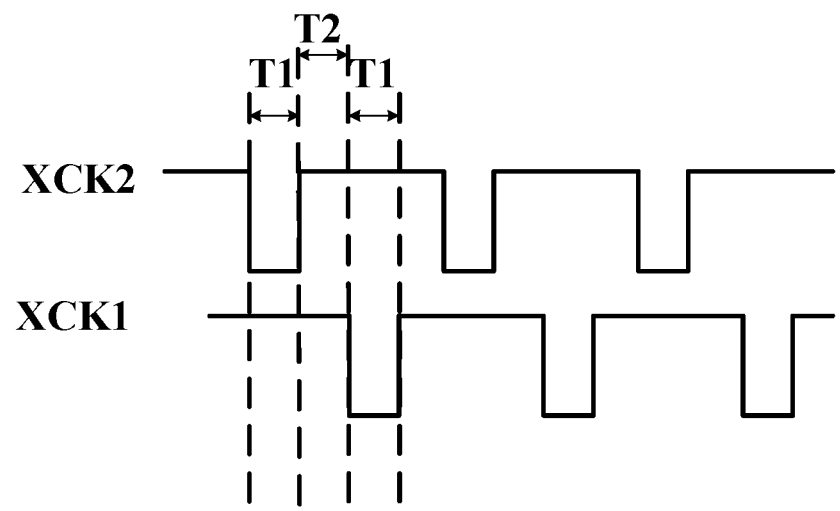
FIG. 17 illustrates an exemplary sequence diagram of a first clock signal and a consistent with various disclosed embodiment of present disclosure.

FIG. 17 is an exemplary sequence diagram of the first sub-clock signal and the second sub-clock signal consistent with various disclosed embodiments of the present disclosure. as shown in FIG. 17, the effective pulse lengths of the first sub-clock signal and the second sub-clock signal may be T1, the effective pulse time sequence of the first sub-clock signal may lag the effective pulse time sequence of the second sub-clock signal by a time length of T2. In other words, the interval between the effective pulse time sequence of the first sub-clock signal and the effective pulse time sequence of the second sub-clock signal may be T2. T2>T1 such that the output signals of the first shift register and the second shift register may be sequentially controlled by the first sub-clock signal and the second sub-clock signal.

In some embodiments of the present disclosure, the first shift register may control the output signal of the odd-numbered shift registers; and the second shift register may control the output signal of the even-numbered shift register. For example, the first shift register may be an odd-numbered shift register among the first shift register ASG1 to the N-th shift register ASGN, and the second shift register may be even-numbered shift register among the first shift register ASG1 to the N-th shift register ASGN.

In other embodiments, the first shift register may also control the output signal of the even-numbered level shift registers; and the second shift register may also control the output signal of the odd-numbered level shift registers. For example, the first shift register may be the even-numbered shift register among the first shift register ASG1 to the N-th shift register ASGN, and the second shift register may be the odd-numbered shift register among the first shift register ASG1 to the N-th shift register ASGN.

Figure 18:
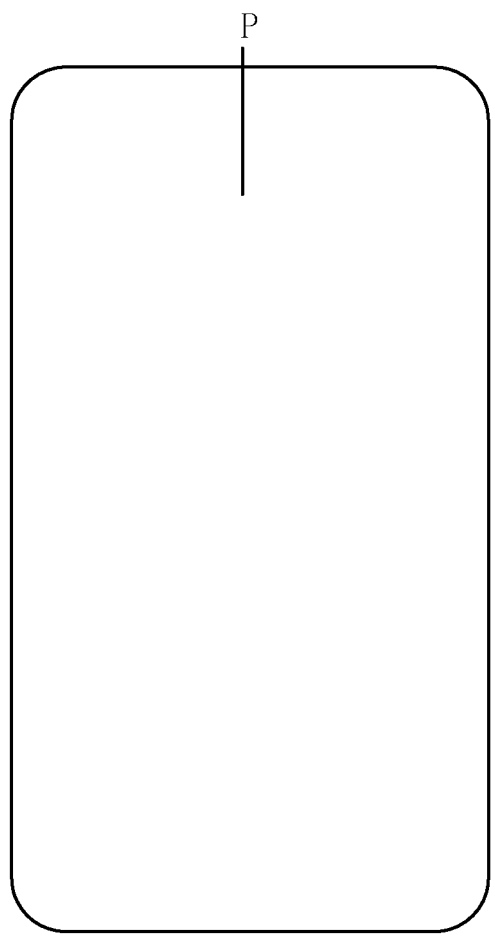
FIG. 18 illustrates an exemplary display device consistent with various disclosed embodiments of the present disclosure.

The present disclosure also provides a display device. FIG. 18 is a schematic structural diagram of an exemplary display device consistent with various disclosed embodiments of the present disclosure. The display device may include a present disclosed display panel or other appropriate display panels. As shown in FIG. 18, the display device P may include, but is not limited to, a full-screen mobile phone, a tablet computer, or a digital camera, etc. Further, the display device P may be a liquid crystal display device, an LED display device, an OLED display device, or a flexible display device, etc.

The technical solutions provided by the present disclosure may have the following advantages:

In the display panel and the display device provided by the present disclosure the first voltage signal and the second voltage signal may be provided to the first control unit, the second control unit and the third control unit to ensure that the first control unit, the second control unit and the third control unit to work at a normal manner. The third voltage signal and the fourth voltage signal may be provided to the fourth control unit to cause the fourth control unit the generate an output signal. Thus, the voltage signal of the fourth control unit and the voltage signals of the first control unit, the second control unit and the third control unit may be set separately. Accordingly, by changing the third voltage signal and the fourth voltage signal, the voltage of the output signal may be changed to allow the voltage of the output signal of the shift register to meet the different voltage requirements of the pixel circuit for different signals. Thus, the flexibility of the voltage of the output signal of the driving circuit may be improved.

Further, because the potential of the first voltage signal may be higher than the potential of the third voltage signal, and/or the potential of the second voltage signal may be lower than the potential of the fourth voltage signal, the waveform stability of the output signal generated by the fourth control unit may be improved.

The various embodiments in this specification are described in a progressive manner. Each embodiment focuses on the differences from other embodiments, and the same or similar parts between the various embodiments can be referred to each other. The above description of the disclosed embodiments enables those skilled in the art to implement or use the present disclosure. Various modifications to these embodiments will be obvious to those skilled in the art, and the general principles defined herein can be implemented in other embodiments without departing from the spirit or scope of the present disclosure. Therefore, the present disclosure will not be limited to the embodiments shown in this text, but should conform to the widest scope consistent with the principles and novel features disclosed in this text.

What is claimed is:

1. A display panel, comprising:
   a pixel circuit, including a driving transistor; and
   a driving circuit, configured to provide a signal for the pixel circuit, receive a third voltage signal and a fourth voltage signal, and generate an output signal, the third voltage signal being a high-level signal, and the fourth voltage signal being a low-level signal;
   wherein:
   a working process of the pixel circuit includes a reset phase and a separate bias phase;
   the output signal of the driving circuit is a reset signal in the reset phase;
   the output signal of the driving circuit is a bias signal in the bias phase; and
   in response to the driving transistor being a P-type transistor, the reset signal is the fourth voltage signal, and the bias signal is the third voltage signal; or
   in response to the driving transistor being an N-type transistor, the reset signal is the third voltage signal, and the bias signal is the fourth voltage signal.

2. The display panel according to claim 1, wherein the pixel circuit includes:
   a data writing module, connected to a source of the driving transistor;
   a compensation module, connected between a gate and a drain of the driving transistor;
   a reset module, connected to the drain of the driving transistor;
   wherein:
   in the reset phase, the reset module and the compensation module are both turned on and the gate of the driving transistor receives the reset signal; and
   in the bias phase, the reset module is turned on and the compensation module is turned off and the drain of the driving transistor receives the bias signal.

3. The display panel according to claim 1, wherein:
   the driving circuit includes N levels of shift registers cascaded with each other, N≥2; and
   a shift register of the N levels of shift registers incudes:
   a first control unit, configured to receive an input signal and control a signal of a first node in response to a first clock signal;
   a second control unit, configured to receive a first voltage signal and control a signal of a second node in response to the input signal and the first clock signal;
   a third control unit, configured to receive the first voltage signal and a second voltage signal and control a signal of a fourth node in response to the signal of the second node and a signal of a third node, wherein the third node is connected to the first node, the first voltage signal is a high-level signal and the second voltage signal is a low-level signal; and
   a fourth control unit, configured to receive the third voltage signal and the fourth voltage signal and generate the output signal in response to the signal of the first node and the signal of the fourth node.

4. The display panel according to claim 3, wherein:
   the first control unit includes a seventh transistor, a source of the seventh transistor being connected to the input signal, a drain of the seventh transistor being connected to the first node, and a gate of the seventh transistor being connected to the first clock signal; and
   the second control unit includes:
   an eighth transistor, a source of the eighth transistor being connected to the first clock signal, a drain of the eighth transistor being connected to the second node, and a gate of the eighth transistor being connected to a fifth node;
   a ninth transistor, a source of the ninth transistor being connected to the first voltage signal, a drain of the ninth transistor being connected to the fifth node, and a gate of the ninth transistor being connected to the input signal; and
   a tenth transistor, a source of the tenth transistor being connected to the first voltage signal, a drain of the tenth transistor being connected to the second node, and a gate drain of the tenth transistor being connected to a first node.

5. The display panel according to claim 3, wherein the second control unit further includes:
   a fifth capacitor, a first electrode plate of the fifth capacitor being connected to the first clock signal, and a second electrode plate of the fifth capacitor being connected to a fifth node.

6. The display panel according to claim 5, wherein the fourth control unit includes:
   a first capacitor, a first electrode plate of the first capacitor being connected to the third voltage signal, a second electrode plate of the first capacitor being connected to the fourth node; and
   a second capacitor, a first electrode plate of the second capacitor being connected to the fourth voltage signal, a second electrode plate of the second capacitor being connected to the second node; or
   the first capacitor, the first electrode plate of the first capacitor being connected to the third voltage signal, the second electrode plate of the first capacitor being connected to the second node; and
   the second capacitor, the first electrode plate of the second capacitor being connected to the fourth voltage signal, the second electrode plate of the second capacitor being connected to the fourth node.

7. The display panel according to claim 6, wherein:
   a capacitance of the first capacitor is greater than a capacitance of the fifth capacitor; and
   a capacitance of the second capacitor is greater than the capacitance of the fifth capacitor.

8. The display panel according to claim 6, wherein the third control unit includes:
   a third capacitor, a first electrode plate of the third capacitor being connected to the third node, and a second electrode plate of the third capacitor being connected to the fourth node; and
   a fourth capacitor, a first electrode of the fourth capacitor being connected to the second node, and a second electrode plate of the fourth capacitor being connected to the first voltage signal.

9. The display panel according to claim 8, wherein:
   a capacitance of the first capacitor is greater than a capacitance of the fourth capacitor; and/or the capacitance of the fourth capacitor is greater than a capacitance of the fifth capacitor; and/or a capacitance of the second capacitor is greater than a capacitance of the third capacitor; and/or the capacitance of the third capacitor is greater than the capacitance of the fifth capacitor.

10. The display panel according to claim 3, wherein the third control unit includes:
a third transistor, a source of the third transistor being connected to the second voltage signal, a drain of the third transistor being connected to the fourth node, and a gate of the third transistor being connected to the third node; and
a fourth transistor, a source of the fourth transistor being connected to the first voltage signal, a drain of the fourth transistor being connected to the fourth node, and a gate of the fourth transistor being connected to the second node.

11. The display panel according to claim 10, wherein the shift register further includes:
a fifth transistor, a source of the fifth transistor being connected to the first voltage signal, a drain of the fifth transistor being connected to the source of the fourth transistor, and a gate of the fifth transistor being connected to the second node; and
a sixth transistor, a source of the sixth transistor being connected to the second voltage signal, a drain of the sixth transistor being connected to the source of the fourth transistor, and a gate of the sixth transistor being connected to the fourth node.

12. The display panel according to claim 10, wherein the fourth control unit includes:
a first transistor and a second transistor, one of the first transistor and the second transistor responding to the signal of the fourth node, and the other one of the first transistor and the second transistor responding to the signal of the second node to control the output signal.

13. The display panel according to claim 3, further comprising:
a first voltage signal line, providing the first voltage signal to the driving circuit;
a second voltage signal line, providing the second voltage signal to the driving circuit;
a third voltage signal line, providing the third voltage signal to the driving circuit;
a fourth voltage signal line, providing the fourth voltage signal to the driving circuit;
wherein:
at least one of the third voltage signal line or the fourth voltage signal line is arranged on a side of at least one of the first voltage signal line or the second voltage signal line facing a display area of the display panel.

14. The display panel according to claim 13, wherein:
the third voltage signal line and the fourth voltage signal line are arranged on the side of the first voltage signal line and the second voltage signal line facing the display area of the display panel; and/or
the first voltage signal line, the second voltage signal line, the third voltage signal line, and the fourth voltage signal line are arranged on a side of the driving circuit facing away from the display area of the display panel.

15. The display panel according to claim 13, wherein:
the first voltage signal line and the second voltage signal line are arranged on the side of the driving circuit facing away from the display area of the display panel; and
the third voltage signal line and the fourth voltage signal line are arranged on a side of the driving circuit facing the display area of the display panel.

16. The display panel according to claim 13, wherein:
a line width of at least one of the first voltage signal line or the second voltage signal line is greater than a line width of at least one of the third voltage signal line or the fourth voltage signal line.

17. The display panel according to claim 3, wherein:
in the N levels of the shift registers of the driving circuit, a signal of the fourth node of an M-th level of the shift registers is connected to an input signal terminal of an (M+1)-th of the shift registers as an input signal of the (M+1)-th of the shift registers, $1 \leq M \leq M+1 \leq N$.

18. The display panel according to claim 1, further comprising:
a first driving circuit and a second driving circuit;
wherein:
a level of at least one of a third voltage signal of the first driving circuit and a third voltage signal of the second driving circuit is higher than a level of the other one of the third voltage signal of the first driving circuit and the third voltage signal of the second driving circuit; and/or
a level of at least one of a fourth voltage signal of the first driving circuit and a fourth voltage signal of the second driving circuit is lower than a level of the other one of the fourth voltage signal of the first driving circuit and the fourth voltage signal of the second driving circuit.

19. The display panel according to claim 18, wherein the first driving circuit provides a third driving signal for the pixel circuit, the second driving circuit provides a fourth driving signal for the pixel circuit, and the third driving signal is different from the fourth driving signal.

20. A display device, comprising:
a pixel circuit, including a driving transistor; and
a display panel, configured to provide a signal for the pixel circuit, receive a third voltage signal and a fourth voltage signal, and generate an output signal, the third voltage signal being a high-level signal, and the fourth voltage signal being a low-level signal;
wherein:
a working process of the pixel circuit includes a reset phase and a separate bias phase;
the output signal of the driving circuit is a reset signal in the reset phase;
the output signal of the driving circuit is a bias signal in the bias phase; and
in response to the driving transistor being a P-type transistor, the reset signal is the fourth voltage signal, and the bias signal is the third voltage signal; or
in response to the driving transistor being an N-type transistor, the reset signal is the third voltage signal, and the bias signal is the fourth voltage signal.

* * * * *